United States Patent
Chen et al.

(10) Patent No.: US 9,412,967 B2
(45) Date of Patent: Aug. 9, 2016

(54) FOLDABLE PACKAGE STRUCTURE

(71) Applicant: Industrial Technology Research Institute, Hsinchu (TW)

(72) Inventors: Kuang-Jung Chen, Hsinchu County (TW); Cheng-Chung Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 169 days.

(21) Appl. No.: 14/527,774

(22) Filed: Oct. 30, 2014

(65) Prior Publication Data

US 2015/0131237 A1     May 14, 2015

Related U.S. Application Data

(60) Provisional application No. 61/902,802, filed on Nov. 12, 2013.

(30) Foreign Application Priority Data

Aug. 1, 2014   (TW) .............................. 103126371 A

(51) Int. Cl.
*H01L 51/52*     (2006.01)
*H01L 51/00*     (2006.01)
*H01L 51/44*     (2006.01)

(52) U.S. Cl.
CPC ........ *H01L 51/5237* (2013.01); *H01L 51/0097* (2013.01); *H01L 51/448* (2013.01); *H01L 51/524* (2013.01); *H01L 2251/5338* (2013.01); *Y02E 10/549* (2013.01)

(58) Field of Classification Search
CPC ............ H01L 51/5237; H01L 51/0097; H01L 51/448; H01L 2251/5338; Y02E 10/549
See application file for complete search history.

(56) References Cited

U.S. PATENT DOCUMENTS

| | | |
|---|---|---|
| 7,652,424 B2 | 1/2010 | Park et al. |
| 8,264,143 B2 | 9/2012 | Bae et al. |
| 8,471,466 B2 | 6/2013 | Seo et al. |
| 8,581,294 B2 | 11/2013 | Lee et al. |

(Continued)

FOREIGN PATENT DOCUMENTS

| | | |
|---|---|---|
| CN | 1874624 | 12/2006 |
| CN | 102898782 | 1/2013 |

(Continued)

OTHER PUBLICATIONS

Garner et al., "Flexible glass substrates for display and lighting applications," IEEE Photonics Conference, Sep. 2013, pp. 176-177.
Kim et al., "Durable polyisobutylene edge sealants for organic electronics and electrochemical devices," Solar Energy Materials and Solar Cells, 2012, pp. 120-125.

(Continued)

*Primary Examiner* — Donald Raleigh
*Assistant Examiner* — Kevin Quarterman
(74) *Attorney, Agent, or Firm* — Jianq Chyun IP Office

(57) ABSTRACT

A foldable package structure including a first substrate, a second substrate, a plurality of adhesive layers and at least one environmental-sensitive electronic component is provided. At least one of the first and second laminated substrates comprises an ultra-thin glass plate. The foldable package structure comprises a predetermined folded region and the ultra-thin glass plate is disposed at one side of the predetermined folded region and stays away from the predetermined folded region.

25 Claims, 25 Drawing Sheets

(56) References Cited

U.S. PATENT DOCUMENTS

| | | |
|---|---|---|
| 2003/0168725 A1 | 9/2003 | Warner et al. |
| 2010/0258346 A1 | 10/2010 | Chen et al. |
| 2011/0037095 A1 | 2/2011 | Park et al. |
| 2012/0064278 A1 | 3/2012 | Chen |
| 2012/0241950 A1 | 9/2012 | Takahashi |

FOREIGN PATENT DOCUMENTS

| | | |
|---|---|---|
| JP | 2007098565 | 4/2007 |
| TW | 200603416 | 1/2006 |
| TW | 200917447 | 4/2009 |
| TW | I308466 | 4/2009 |
| TW | 201044899 | 12/2010 |
| TW | 201110203 | 3/2011 |
| TW | 201143503 | 12/2011 |
| TW | 201222683 | 6/2012 |
| TW | I389271 | 3/2013 |
| TW | 201417265 | 5/2014 |
| TW | 201436075 | 9/2014 |

OTHER PUBLICATIONS

Han et al., "The encapsulation of an organic light-emitting diode using organic-inorganic hybrid materials and MgO," Organic Electronics, 2011, pp. 609-613.

Kim et al., "Demonstration of hybrid prototype sealant for encapsulating organic photovoltaics, " IEEE 38th Photovoltaic Specialists Conference, 2012, pp. 1-5.

Logunov et al., "Laser Assisted Frit Sealing for High Thermal Expansion Glasses, " Journal of Laser Micro/Nanoengineering, 2012, pp. 326-333.

Park et al., "Encapsulation Method of OLED with Organic-inorganic Protective Thin Films Sealed with Flat Glass, " Journal of the Korean Institute of Electrical and Electronic Material Engineers, May 2012, pp. 381-386.

"Office Action of Taiwan Counterpart Application," issued on Jan. 9, 2015, p. 1-p. 10.

"Office Action of Taiwan Related Application, application No. 102133165", issued on Jul. 23, 2015, p. 1-p. 16.

"Office Action of Taiwan Counterpart Application" , issued on Apr. 18, 2016, p. 1-p. 5.

"Office Action of China Counterpart Application" , issued on Apr. 21, 2016, p. 1-p. 6.

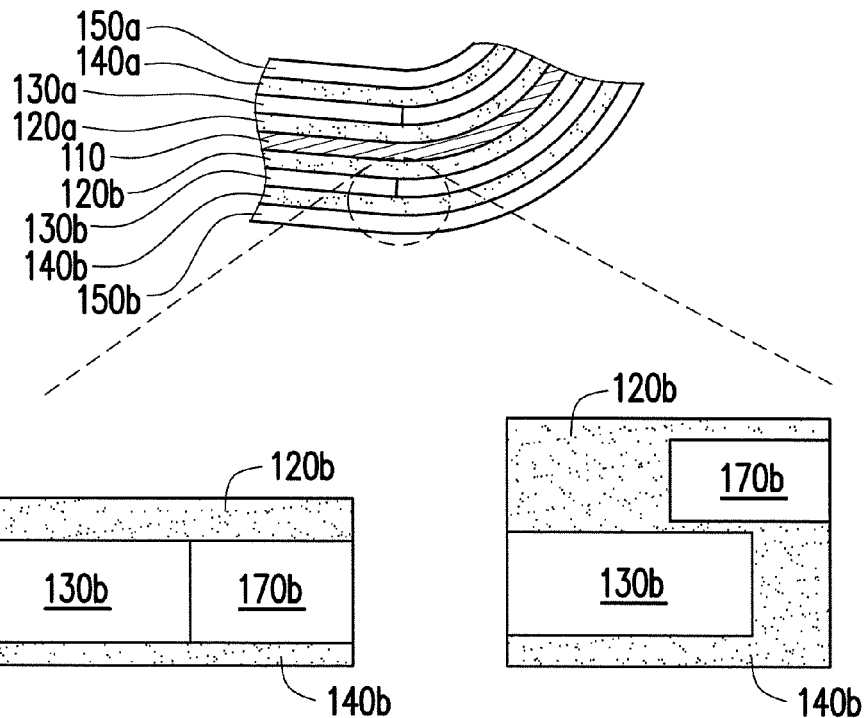
FIG. 3C
FIG. 3D
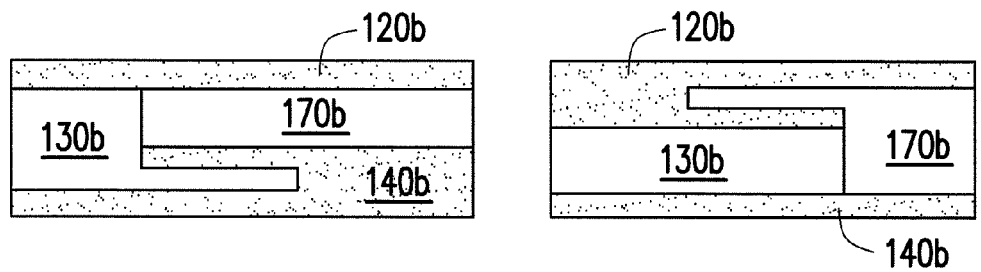
FIG. 3E
FIG. 3F
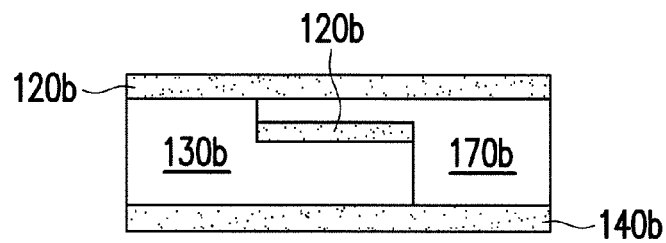
FIG. 3G

FOLDABLE PACKAGE STRUCTURE

CROSS-REFERENCE TO RELATED APPLICATION

This application claims the priority benefits of U.S. provisional application Ser. No. 61/902,802, filed on Nov. 12, 2013 and Taiwan application serial no. 103126371, filed on Aug. 1, 2014. The entirety of each of the above-mentioned patent applications is hereby incorporated by reference herein and made a part of this specification.

BACKGROUND

1. Field of the Disclosure

The present disclosure relates to a foldable package structure, it also relates to a foldable package structure having an ultra-thin glass plate as well as a foldable package structure having one or more environmental-sensitive electronic components therein.

2. Description of Related Art

Following the advancement of technology, portable or handheld electronic products of slimness and lightness are booming and the foldable displays further promote the popularization of portable or handheld electronic products.

For the package structure having one or more environmental-sensitive electronic components, it generally requires to retain the barrier against vapour and oxygen and maintain the sealing of the package structure to protect its internal environmental-sensitive electronic components (especially organic light-emitting diode) from the influences of outside environmental temperature and humidity, thus avoiding performance failure, fast decay or even damaging the environmental-sensitive electronic components. However, the folding packaging technology required for the foldable displays, in addition to satisfying the requirement for moisture barrier, has to withstand repeated folding with less cracks or rupture to ensure the quality of the product as well as the product life.

SUMMARY

One embodiment of the present disclosure provides a foldable package structure comprising first and second laminated substrates, first, second and third adhesive layers and at least one environmental-sensitive electronic component. The first laminated substrate comprises a first substrate, a first adhesive layer and at least two pieces of a first ultra-thin glass plate. The second laminated substrate is disposed on one side of the first laminated substrate and comprises a second substrate. The second adhesive layer is disposed on the first laminated substrate and located between the first and second laminated substrates. The at least one environmental-sensitive electronic component is disposed on the second adhesive layer and located between the first and second laminated substrates. The third adhesive layer is disposed between the at least one environmental-sensitive electronic component and the second laminated substrate. The foldable package structure comprises at least one predetermined folded region, the at least two pieces of the first ultra-thin glass plate are disposed respectively at two opposite sides of the at least one predetermined folded region but keep away from the at least one predetermined folded region.

One embodiment of the present disclosure provides a foldable package structure comprising first and second laminated substrates, first, second and third adhesive layers and first and second electronic components. The first laminated substrate comprises a first substrate, a first adhesive layer and a first ultra-thin glass plate. The second laminated substrate is disposed on an opposing side of the first laminated substrate and comprises a second substrate. The second adhesive layer is disposed on the first laminated substrate. The first electronic component is disposed on the second adhesive layer and between the first and second laminated substrates, and the first electronic element is an environmental-sensitive electronic component. The second electronic component is disposed on the second adhesive layer and between the first and second laminated substrates, and the second electronic component has an environmental-blocking requirement different from that of the first electronic component. The third adhesive layer is disposed between the first and second electronic components and the second laminated substrate. The foldable package structure comprises at least one predetermined folded region, the first electronic component is arranged at one side of the at least one predetermined folded region, while the second electronic component is arranged at the other side of the at least one predetermined folded region. The first ultra-thin glass plate is arranged corresponding to the one side of the at least one predetermined folded region with the first electronic component and keeps away from the at least one predetermined folded region as well as the other side of the at least one predetermined folded region with the second electronic component.

In order to make the disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIGS. 3C-3G are schematic cross-sectional views illustrating the joining portions of the predetermined folded regions of a foldable package structure according to one embodiment of the present disclosure.

DESCRIPTION OF THE EMBODIMENTS

Figure 1A:
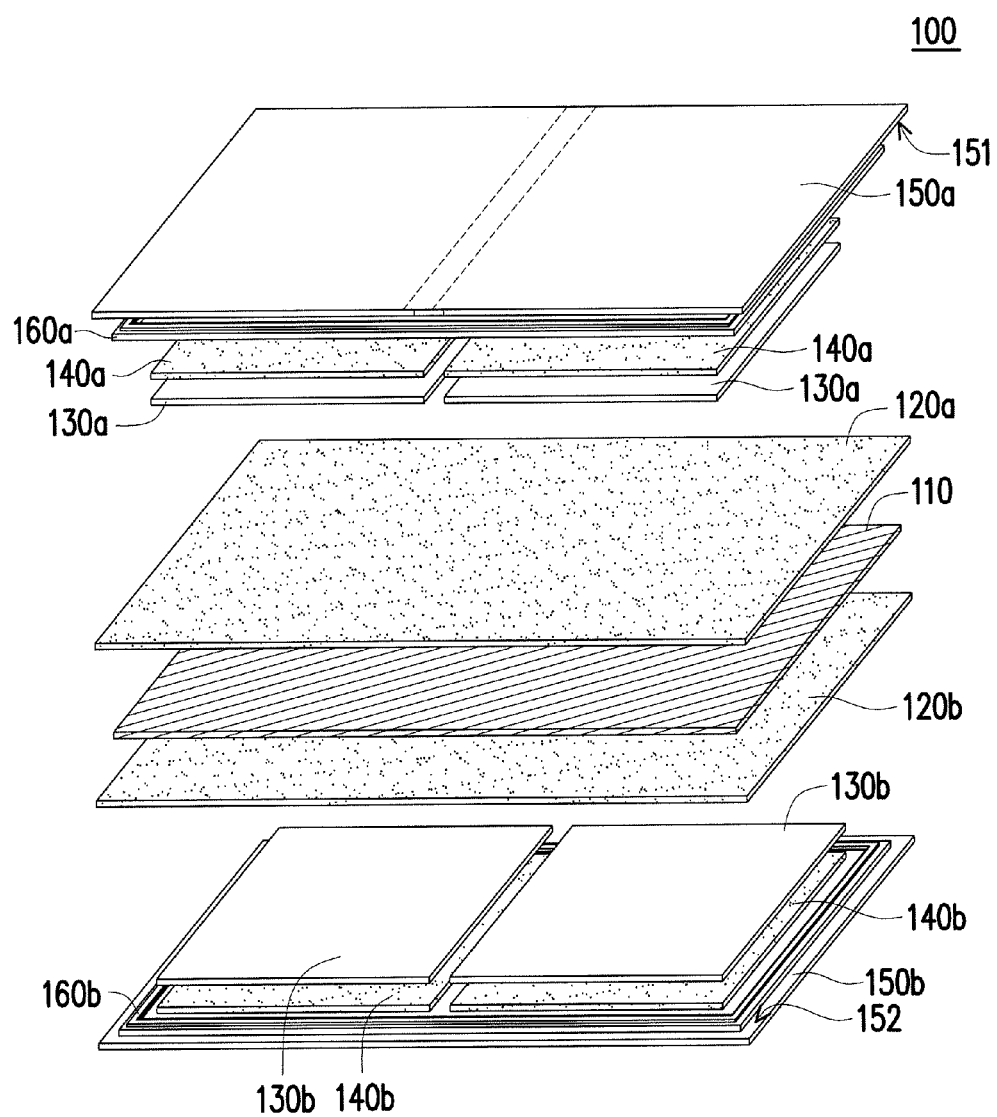
FIG. 1A is a schematic view of a foldable package structure according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts. In the following embodiments, one or more foldable package structures having at least one environmental-sensitive electronic component therein are described. In the embodiments, the environmental-sensitive electronic component(s) may use the organic light emitting diode (OLED) as an example, but the environmental-sensitive electronic components may also be liquid crystal displays, organic sensing elements, solar panels or other environmental-sensitive electronic components. The cited examples, the number or the sizes of the components illustrated in the drawings are merely for the convenience of explanations, but do not represent the actual proportion or size of the components. It is not intended to limit the method or the part structure by the exemplary embodiments described herein.

Figure 1B:
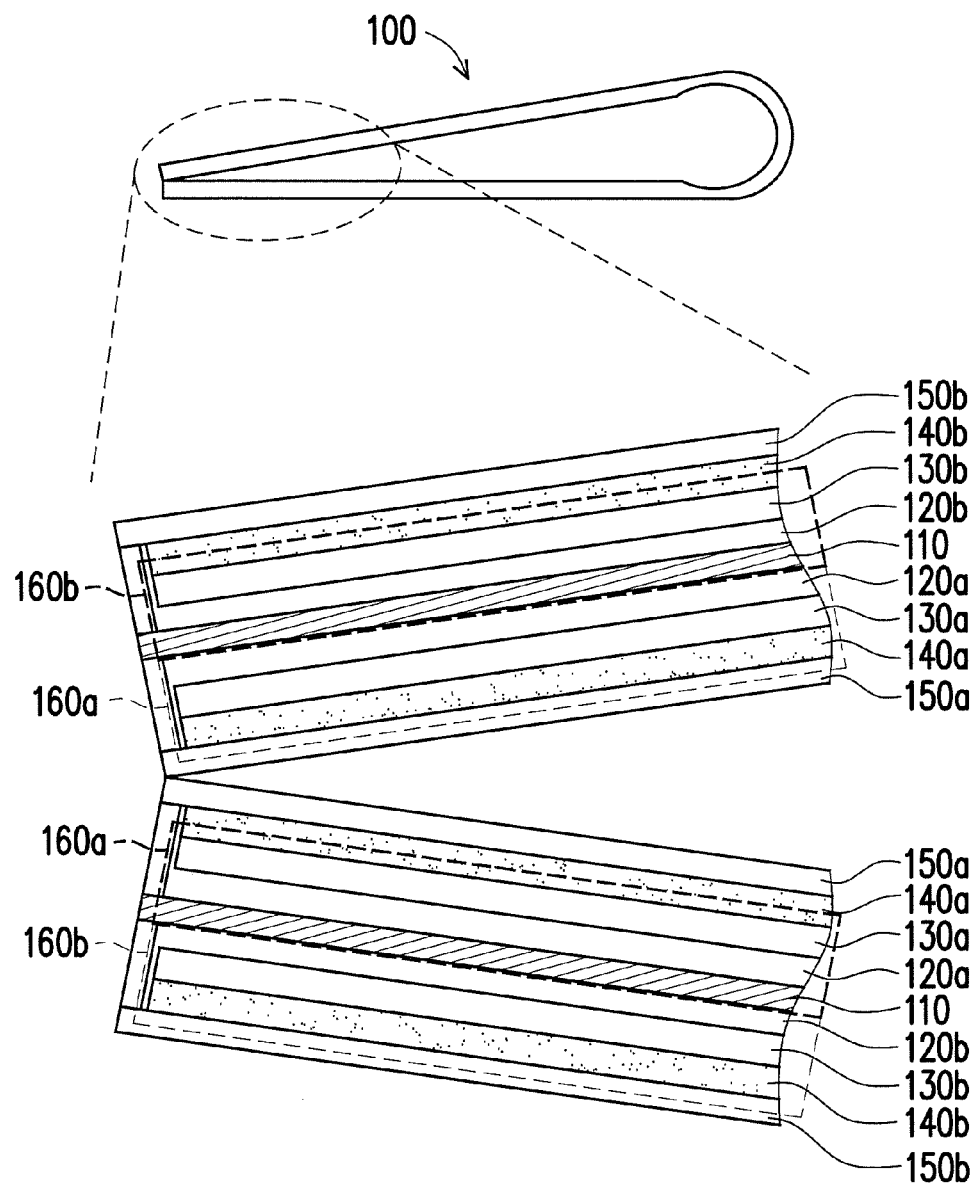
FIG. 1B is a schematic cross-sectional view of a foldable package structure according to one embodiment of the present disclosure.

FIG. 1A is a schematic view of a foldable package structure according to one embodiment of the present disclosure. FIG. 1A is a schematic exploded view of the foldable package structure before assembling the electronic component and the layers to be laminated together (the laminated layers). In FIG. 1A, the electronic component and the laminated layers are shown to be separated from one another. FIG. 1B is a schematic cross-sectional view of a foldable package structure according to one embodiment of the present disclosure. FIG. 1B shows the folded configuration of the foldable package structure by matching the opposite sides of the foldable package structure and the enlarged cross-sectional view of the non-folded regions of the foldable package structure. Referring to FIG. 1A, in the present embodiment, the foldable package structure 100 (from the outermost part to the inner part) comprises the first and second substrates 150a, 150b, the first and fourth adhesive layers 140a, 140b, the first and second ultra-thin glass plates 130a, 130b, the second and third adhesive layers 120a, 120b and at least one environmental-sensitive electronic component 110. The second and third adhesive layers 120a, 120b are respectively disposed on upper and lower sides of the environmental-sensitive electronic component 110. The first and second ultra-thin glass plates 130a, 130b are respectively arranged on the second and third adhesive layers 120a, 120b, and the first and fourth adhesive layers 140a, 140b are respectively disposed on the first and second ultra-thin glass plates 130a, 130b. That is, the first ultra-thin glass plate 130a is sandwiched between the first and second adhesive layers 140a, 120a, while the second ultra-thin glass plate 130b is sandwiched between the third and fourth adhesive layers 120b, 140b. The first and second substrates 150a, 150b are respectively bonded to the first and second ultra-thin glass plates 130a, 130b through the first and fourth adhesive layers 140a, 140b and the environmental-sensitive electronic component 110 is sandwiched between the first and second substrates 150a, 150b through the second and third adhesive layers 120a, 120b. Taking the environmental-sensitive electronic component 110 as the center, the first substrate 150a, the first adhesive layer 140a and the first ultra-thin glass plate 130a superposed together may be regarded as a top laminated substrate (the top cover), and the second ultra-thin glass plate 130b, the fourth adhesive layer 140b and the second substrate 150b superposed together may be considered as the bottom laminated substrate (the bottom cover). The top (upper) and bottom (lower) laminated substrates may be regarded as the first and second laminated substrates. Herein, the first or second is not specifically referred to the top or bottom direction or to limit the relative positions.

Referring to FIG. 1A, the first ultra-thin glass plate 130a or the second ultra-thin glass plate 130b is in fact designed to include two separate glass plates, and these two separate glass plates are arranged apart and respectively at two opposite sides of the predetermined folded region of the foldable package structure 100, thus keeping away from the predetermined folded region of the foldable package structure 100. The dotted line in the figure marks the predetermined folded region, and the two opposite sides of the dotted line represents the predetermined non-folded regions. In this case, when the package is folded along the predetermined folded region (the dotted line), the first ultra-thin glass plate 130a or the second ultra-thin glass plate 130b will not be broken or cracked. In this embodiment, the first ultra-thin glass plate 130a or the second ultra-thin glass plate 130b is used to reinforce the rigidity of the package structure and to increase the vapor- or oxygen-blocking capability. In addition, due to the design of isolated glass plates, the folding of the foldable package structure will not be hindered by these ultra-thin glass plates. Although in this embodiment each of the ultra-thin glass plate is designed to be two separate glass plates (or sheets) beside the folded region, it is understandable to the artisan in this field that the ultra-thin glass plate may be designed to be two or more separate glass sheets or plates and arranged along the folded region(s). Corresponding to the design of the ultra-thin glass plate as two separate glass plates, each of the first and the fourth adhesive layers 140a, 140b may also be designed to be two separate adhesive layers or sheets. Herein, the design of using two separate plates or sheets not only is beneficial for the folded configuration, but also is cost-effective, when compared with the design of using one single plate or sheet.

Please refer to FIGS. 1A and 1B, in this embodiment, the material of the first and second substrates 150a, 150b may be a plastic material or a polymeric material, such as polyimide (PI), hybrid PI, polyethylene terephthalate (PET), polyether sulfone (PES), polyethylene naphthalate, polyethylene terephthalate (PEN), cyclic olefin polymer (COP), glass fiber reinforced plastic (i.e. fiberglass reinforced plastic substrates) and so on. The thickness of each of the first and second substrates 150a, 150b may be substantially the same or almost the same and ranges between, for example, 1 μm~500 μm and preferably 5 μm~30 μm. The thickness of the ultra-thin glass plate is less than or equal to 100 μm. The materials for forming the first and fourth adhesive layers 140a, 140b or the second and third adhesive layers 120a, 120b may be optically clear adhesives, pressure sensitive adhesives, thermosetting glues or UV-curable glues, and the first and fourth adhesive layers 140a, 140b and the second and third adhesive layers 120a, 120b may be formed with the same or different materials. If the first and second substrates 150a, 150b are formed with semi-dried PI films, the application of the first and fourth adhesive layers 140a, 140b may be omitted. The environmental-sensitive electronic component 110 may be, for example, an OLED element, a liquid crystal display (LCD) element, a solar cell or an electrophoretic display (EPD) element (such as the electronic paper).

Figure 1C:
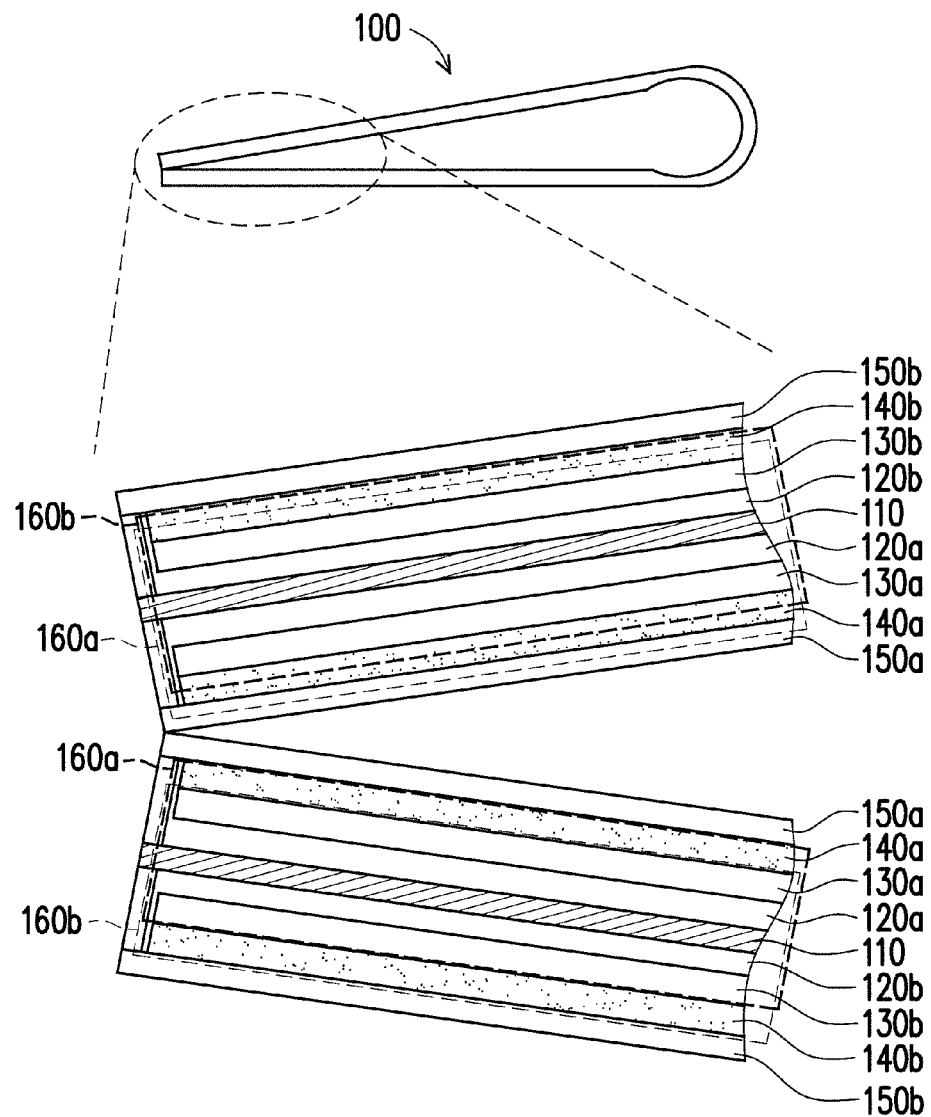
FIG. 1C is a schematic cross-sectional view of a foldable package structure according to one embodiment of the present disclosure.

Referring to FIGS. 1A, 1B and 1C, there are sidewall barrier structures 160a, 160b located on the opposing surfaces of each of the first and second substrates 150a, 150b. That is, the sidewall barrier structure 160a is disposed on the lower surface 151 of the first substrate 150a, while the sidewall barrier structure 160b is disposed on the upper surface 152 of the second substrate 150b. The sidewall barrier structures 160a, 160b are generally located in the non-display areas of the panel or display or located in the non-touch areas of the touch panel, e.g., located in the outer peripheral regions of the first and second substrates 150a, 150. When the package structure is assembled and laminated together, the sidewall barrier structures 160a, 160b are respectively located between the environmental-sensitive electronic component 110 and the first and second substrates 150a, 150b. Meanwhile, the sidewall barrier structures 160a, 160b surround the four sides of the environmental-sensitive electronic component 110 (see FIG. 1A) or are arranged along at least one side of the environmental-sensitive electronic component 110. Referring to FIG. 1B, the sidewall barrier structures 160a, 160b may surround the outer edges of the first and second ultra-thin glass plates 130a, 130b and surround the four sides of the environmental-sensitive electronic component 110. In this embodiment, both of the first and second substrates 150a, 150b have the sidewall barrier structures 160a, 160b, however, depending on the moisture barrier requirements of the package structure, it is possible that only the first substrate 150a or the second substrate 150b comprises the sidewall barrier structure disposed thereon.

Figure 1D:
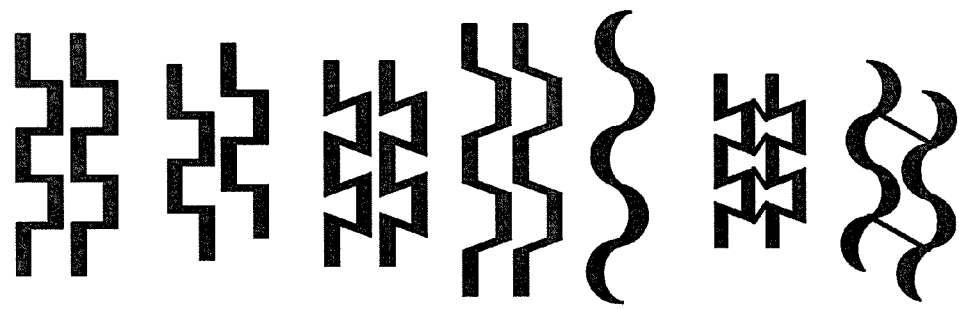
FIG. 1D illustrates possible schematic views of a sidewall barrier structure of a foldable package structure according to one embodiment of the present disclosure.
Figure 1E:
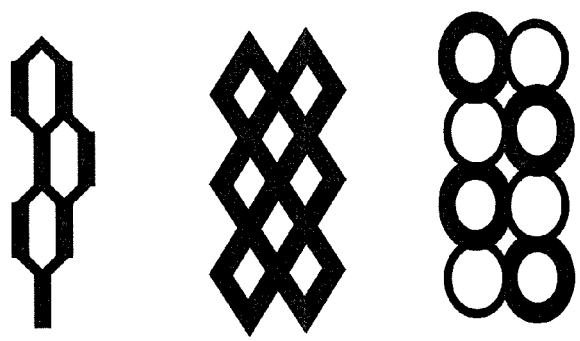
FIG. 1E illustrates possible schematic views of a sidewall barrier structure of a foldable package structure according to one embodiment of the present disclosure.
Figure 1E:
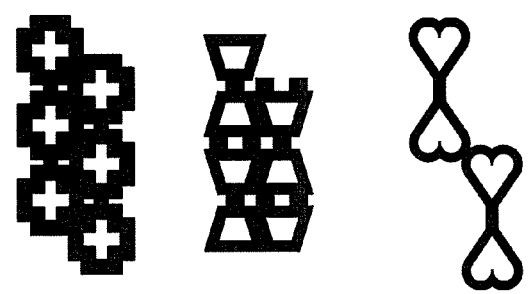

In the present embodiment, the sidewall barrier structures 160a, 160b are respectively disposed on the first and second substrates 150a, 150b and are connected to or partially attached to the first and second substrates 150a, 150b. The sidewall barrier structures 160a, 160b may be designed to be one or more continuous annular structures surrounding a specific region, for example, and is designed to have a bottom surface of a specific shape. The bottom surface of the sidewall barrier structure is the cross section of the sidewall barrier structure perpendicular to the substrate. The specific shape of the bottom surface of the sidewall barrier structure may be shown in FIG. 1D, and includes, for example, square saw-toothed stripes, trapezoidal saw-toothed stripes, curved-wave stripes or square-wave stripes, the stripes with the same or different thickness, cross-linked or non-cross-linked with each other. In FIG. 1E, the bottom surface of the sidewall barrier structure may be in the specific shape, such as, the hexagonal mesh shape, the circular mesh shape, cross-formed mesh shape, ladder-formed mesh shape or heart-formed mesh shape, and the mesh may be formed with the cords of the same or different thickness, equally or unequally cross-linked. Of course, the quantity of the sidewall barrier structure(s) may be one or more and the sidewall barrier structure(s) may be a single or polycyclic ring structure. In other embodiments not shown, the sidewall barrier structure(s) may be a non-continuous three-dimensional structure, such as, a straight wall structure disposed only at one side of the environmental-sensitive electronic component, or an L-shaped or U-shaped wall structure surrounding the environmental-sensitive electronic component(s), or even a group of isolated wall structures surrounding the environmental-sensitive electronic component(s).

In the above embodiment, only one single environmental-sensitive electronic component 110 is described as an example, it will be appreciated that the foldable package structure may also comprise more than one environmental-sensitive electronic components, which are the same or different.

Figure 2:
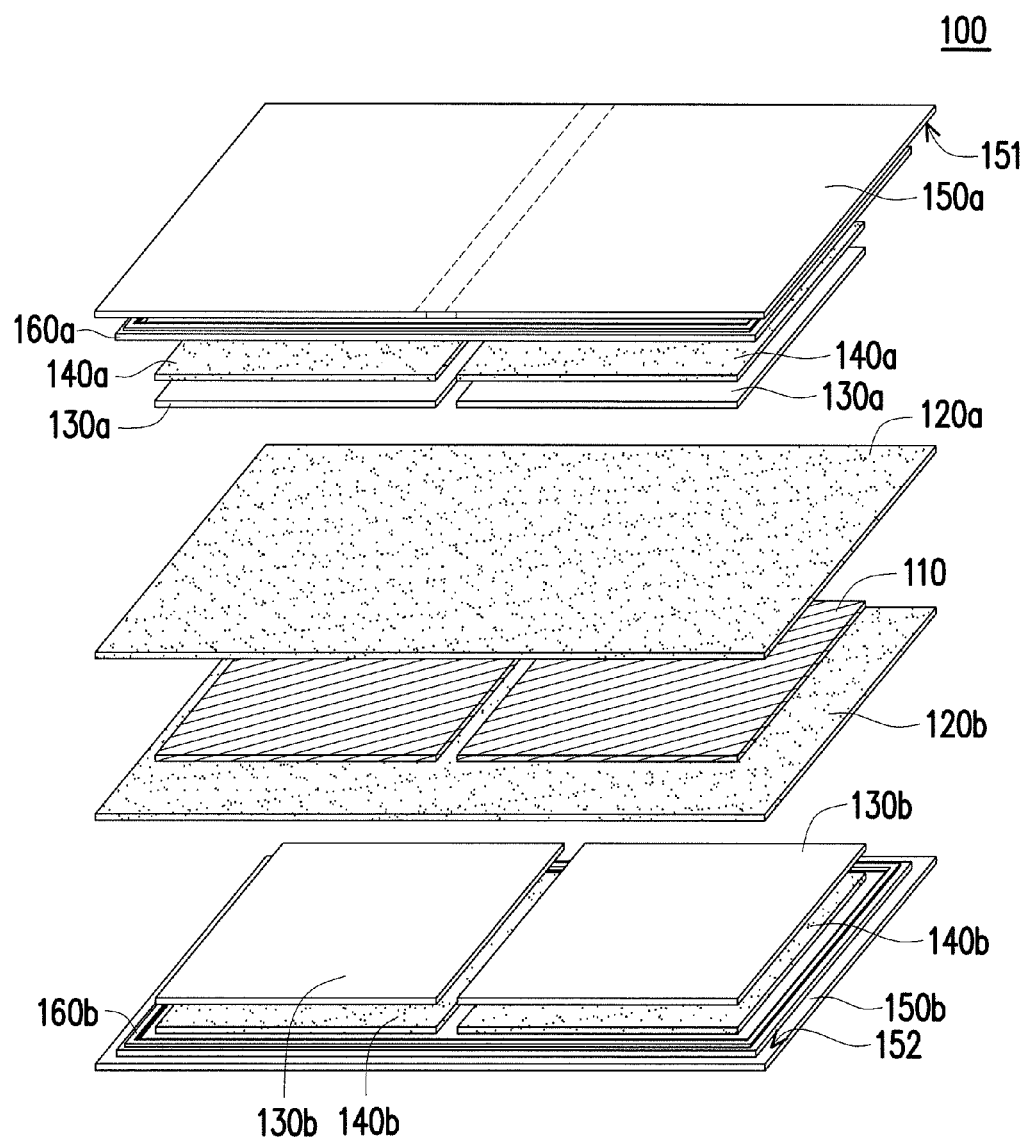
FIG. 2 is a schematic view of a foldable package structure according to one embodiment of the present disclosure.

FIG. 2 is a schematic view of a foldable package structure according to another embodiment of this disclosure. Referring to FIG. 2, in the present embodiment, the foldable package structure 100 (from the outermost part to the inner part) comprises the first and second substrates 150a, 150b, the first and fourth adhesive layers 140a, 140b, the first and second ultra-thin glass plates 130a, 130b, the second and third adhesive layers 120a, 120b and the two environmental-sensitive electronic components 110. The second and third adhesive layers 120a, 120b are respectively disposed on the upper and lower sides of the environmental-sensitive electronic components 110. The first and second ultra-thin glass plates 130a, 130b are arranged on the second and third adhesive layers 120a, on the 120b, and the first and fourth adhesive layers 140a, 140b are disposed on the first and second ultra-thin glass plates 130a, 130b. That is, the first and second ultra-thin glass plates 130a, 130b are respectively sandwiched between the first adhesive layer 140a and the second adhesive layer 120a and between the third adhesive layer 120b and the fourth adhesive layer 140b. The first and second substrates 150a, 150b are bonded to the first and second ultra-thin glass plates 130a, 130b through the first and fourth adhesive layers 140a, 140b and sandwich the two environmental-sensitive electronic components 110 through the second and third adhesive layers 120a, 120b.

Figure 3A:
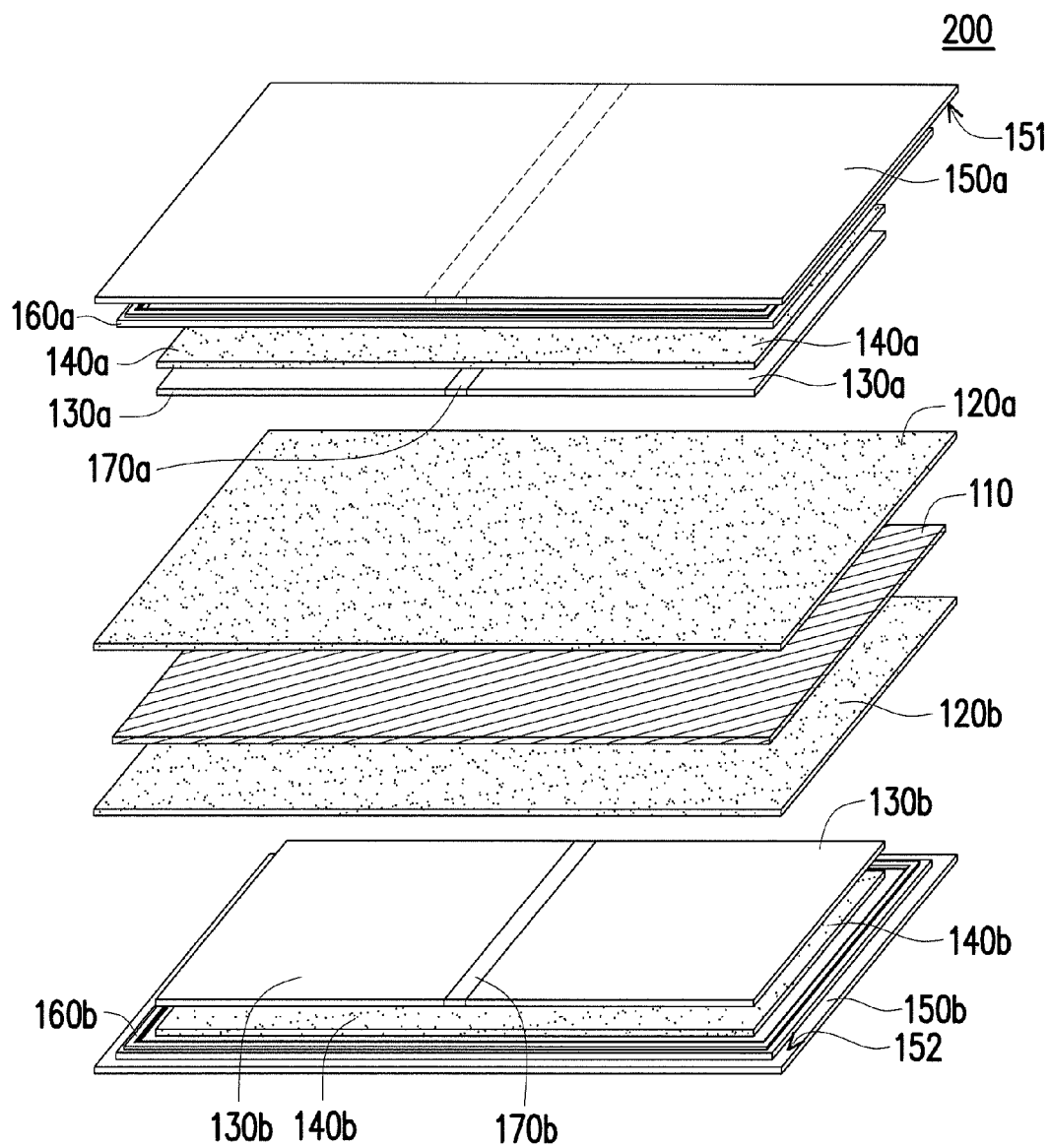
FIG. 3A is a schematic view of a foldable package structure according to another embodiment of the present disclosure.
Figure 3B:
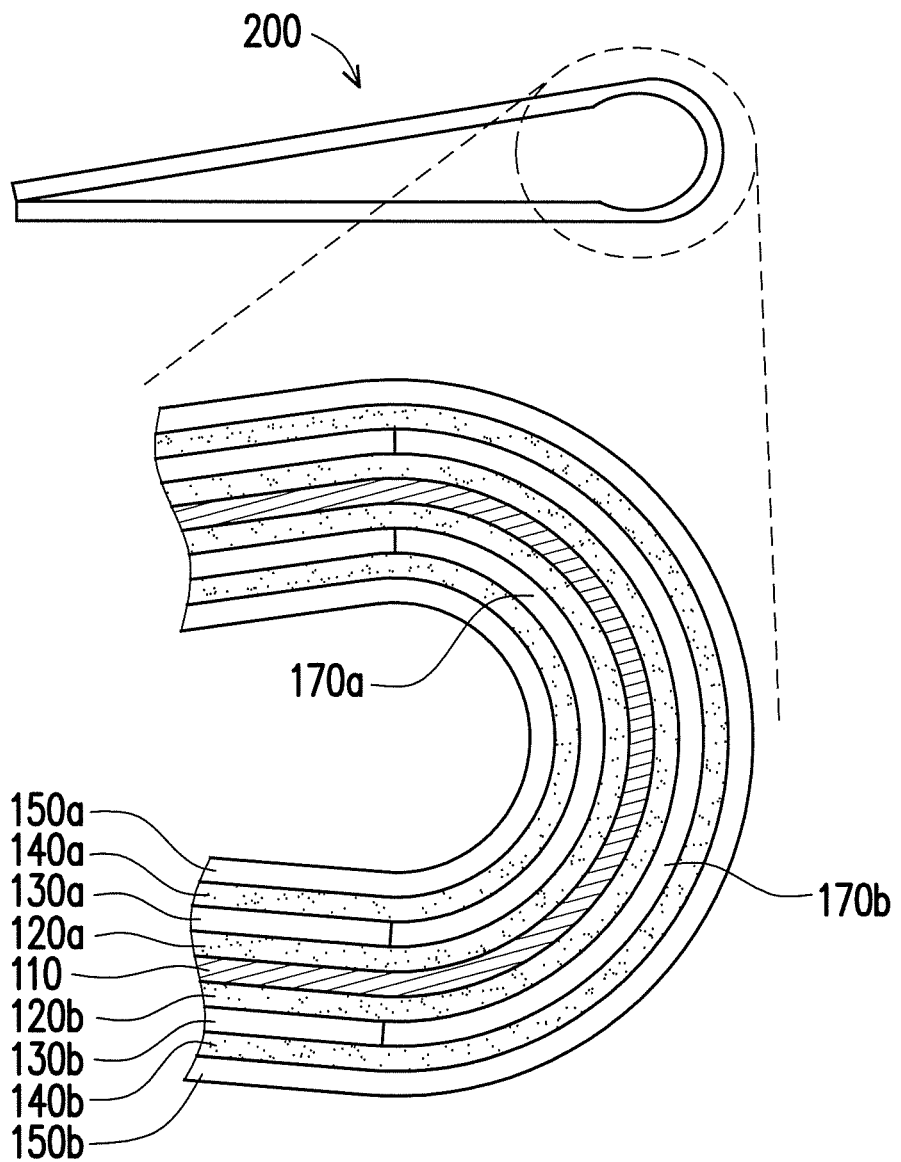
FIG. 3B is a schematic cross-sectional view of a foldable package structure according to another embodiment of the present disclosure.

FIG. 3A is a schematic view of a foldable package structure according to another embodiment of the present disclosure. FIG. 3A is a schematic exploded view of the foldable package structure before assembling the electronic component and the layers to be laminated together (the laminated layers). In FIG. 3A, the electronic component and the laminated layers are shown to be separated from one another. FIG. 3B is a schematic cross-sectional view of a foldable package structure according to another embodiment of the present disclosure. FIG. 3B shows the folded configuration of the foldable package structure by matching the opposite sides of the foldable package structure and the enlarged cross-sectional view of the non-folded regions of the foldable package structure. Referring to FIG. 3A, in the present embodiment, the foldable package structure 200 (from outermost to innermost) comprises the first and second substrates 150a, 150b, the first and fourth adhesive layers 140a, 140b, the first and second ultra-thin glass plates 130a, 130b, the second and third adhesive layers 120a, 120b and at least one environmental-sensitive electronic component 110. Compared with the foldable package structure 100 of the previous embodiment(s), the packaging materials or the laminated structure of the foldable package structure 200 in this embodiment are quite similar and the same reference numerals may be used to mark the same or similar parts. For the foldable package structure 200, the first ultra-thin glass plate 130a or the second ultra-thin glass plate 130b is designed to be two separate glass plates, and these two separate glass plates are arranged apart and respectively at two opposite sides of the predetermined folded region of the foldable package structure 200, thus keeping away from the predetermined folded region of the foldable package structure 200. The dotted line in the figure marks the predetermined folded region, and the two opposite sides of the dotted line represents the predetermined non-folded regions. In this case, when the package is folded along the predetermined folded region (the dotted line), the first ultra-thin glass plate 130a or the second ultra-thin glass plate 130b will not be broken or cracked. Although in this embodiment the ultra-thin glass plate is designed to be two separate glass plates arranged beside the predetermined folded region, the first adhesive layer 140a or the fourth adhesive layer 140b is designed to be one single layer, rather than two isolated pieces.

In this embodiment, the foldable package structure 200 further comprises the reinforced barrier layers 170a, 170b respectively disposed at the locations corresponding to the predetermined folded region. The reinforced barrier layer 170a is disposed between the two pieces of the first ultra-thin glass plate 130a and sandwiched between the first adhesive layer 140a and the second adhesive layer 120a. The reinforced barrier layer 170b is disposed between the two pieces of the second ultra-thin glass plate 130b and sandwiched between the fourth and the third adhesive layers 140b, 120b. Each of the reinforced barrier layers 170a, 170b may include a plastic barrier film, a metal foil barrier film, a glass fiber barrier film or a composite material barrier film.

Referring to FIG. 3B, since the reinforced barrier layers 170a, 170b are arranged at the position corresponding to the predetermined folded region and the first and second ultra-thin glass plates 130a, 130b are not located at the folded region, the reinforced barrier layers 170a, 170b located at the folded region sandwich the environmental-sensitive electronic component 110 and the second and third adhesive layers 120a, 120b in-between. That is, when be folded, the second and third adhesive layers 120a, 120b and the environmental-sensitive electronic component 110 are sandwiched by the reinforced barrier layers 170a, 170b. Although there is no glass plate arranged at the folded region, the reinforced barrier layers 170a, 170b can provide further moisture barrier and protect the environmental-sensitive electronic component 110 from being damaged by environmental factors.

FIGS. 3C-3G are schematic cross-sectional views illustrating the joining portions of the predetermined folded regions of a foldable package structure according to another embodiment of the present disclosure. FIGS. 3C-3G mainly illustrate the marginal parts of the folded region to show the relative positions for the ultra-thin glass plate, the reinforced barrier layers and the upper and lower adhesive layers. In FIG. 3C, within the foldable package structure 200, the second ultra-thin glass plate 130b and the reinforced barrier layer 170b are end-to-end jointed. In FIG. 3D, the second ultra-thin glass plate 130b and the reinforced barrier layer 170b are staggered and the ends of both are overlapped. In FIG. 3E, the second ultra-thin glass plate 130b and the reinforced barrier layer 170b are end-to-end jointed, but the second ultra-thin glass plate 130b has a finger extended beyond the end of the reinforced barrier layer 170b. In FIG. 3F, the second ultra-thin glass plate 130b and the reinforced barrier layer 170b are end-to-end jointed, but reinforced barrier layer 170b has a finger extended beyond the end of the second ultra-thin glass plate 130b. In FIG. 3G, the second ultra-thin glass plate 130b and the reinforced barrier layer 170b are end-to-end jointed, but the L-shaped ends of the second ultra-thin glass plate 130b and the reinforced barrier layer 170b are staggered and overlapped. The staggered and overlapped configuration can further enhance the moisture barrier capability and ensure the reliability of the electronic component. The reinforced barrier layers 170a, 170b can strengthen the barrier effect of the predetermined folded region.

Figure 4A:
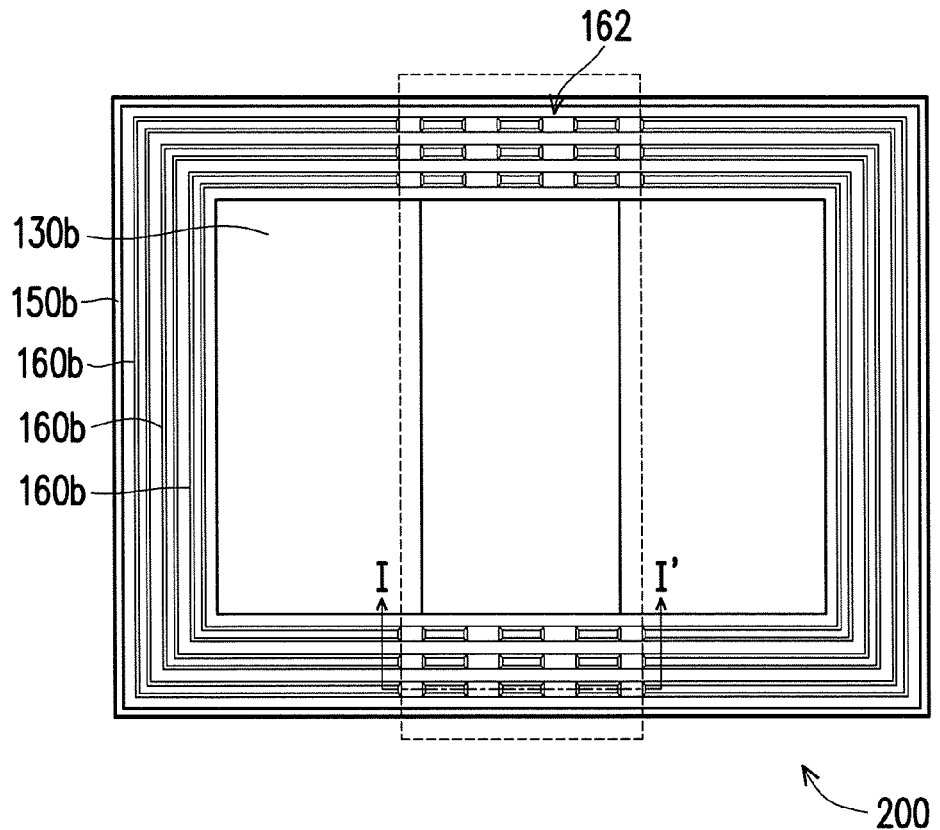
FIG. 4A is a schematic top view illustrating the predetermined folded region of a foldable package structure according to another embodiment of the present disclosure.
Figure 4B:
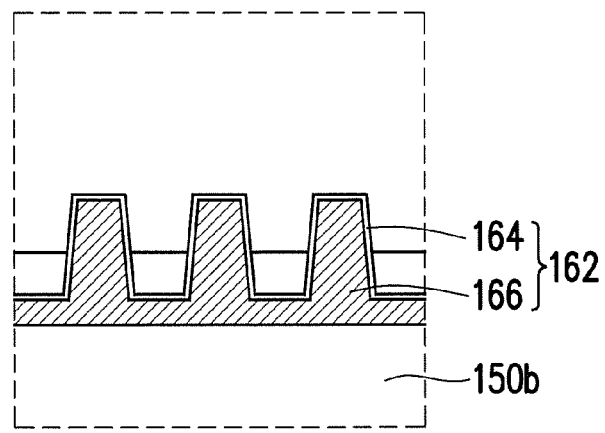
FIG. 4B is a schematic cross-sectional view showing a portion of the foldable package structure of FIG. 4A around the predetermined folded region.

FIG. 4A is a schematic top view illustrating the predetermined folded region of a foldable package structure according to another embodiment of the present disclosure. FIG. 4B is a schematic cross-sectional view showing a portion of the foldable package structure of FIG. 4A around the predetermined folded region.

Referring to FIGS. 4A and 4B, in this embodiment, the sidewall barrier structure(s) 160b is substantially the annular wall structure located on the substrate 150b, and a plurality of the sidewall barrier structures 160b is arranged in parallel and surrounds a specific region. For example, each of the sidewall barrier structures 160b located within the predetermined folded region (circled by the dotted line) comprises a plurality of flexural stress dispersion structures 162 formed by etching. The cross-section of the flexural stress dispersion structure 162 may be a polygonal, round or oval section. In the present embodiment, the cross-section of the flexural stress dispersion structure 162 is trapezoidal as an example for descriptions, and the flexural stress dispersion structure 162 comprises a barrier layer 164 and an underlying cladding layer 166. Two adjacent flexural stress dispersion structures 162 are connected to each other through the barrier layer 164, for example, to form a continuous structure that is recessed at specific locations for easy folding. Of course, in other embodiments not shown, the flexural stress dispersion structures 162 may be non-continuous isolated structures, and no further limitations should be imposed. The details of the aforementioned features of the sidewall barrier structures or flexural stress dispersion structures may be referred to US patent publication No. 2014/118,975 A1.

The sidewall barrier structures 160b of this embodiment may be arranged in an annular configuration and in parallel to one another, and the flexural stress dispersion structures 162 are arranged in parallel within the predetermined folded region. Therefore, when the foldable package structure 200 is folded along the predetermined folded region (dotted line), the flexural stress dispersion structures 162 can help distribute the flexural stress resulted from folding and avoid the deformation of the sidewall barrier structures 160b at the predetermined folded region.

Figure 4C:
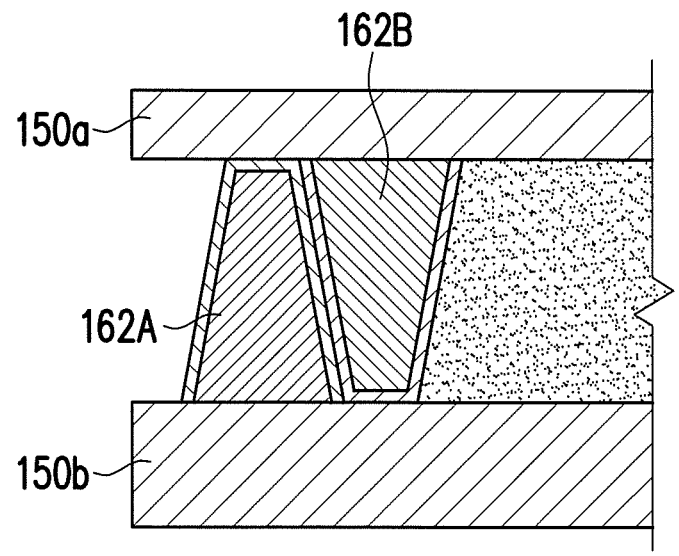
FIGS. 4C-4D are cross-sectional views showing a portion of the foldable package structure according to two embodiments of the present disclosure.
Figure 4D:
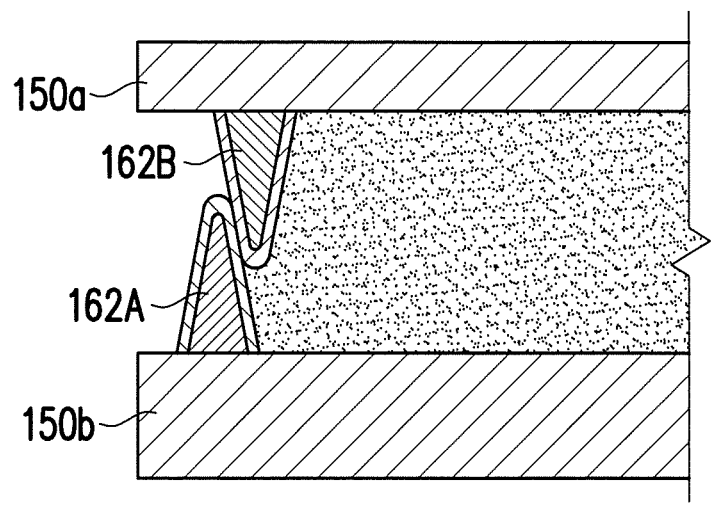

In addition, the foldable package structure 200 may be designed to omit the adhesive layer within the region arranged with the sidewall barrier structures 160a, 160b, and the sidewall barrier structures 160a, 160b may be designed to include flexural stress dispersion structures 162A, 162B. FIGS. 4C-4D are cross-sectional views showing a portion of the foldable package structure according to two embodiments of the present disclosure. In FIG. 4C, the flexural stress dispersion structures 162A and 162B are arranged against each other and in direct contact with the first and second substrates 150a, 150b, without the adhesive layer. In FIG. 4D, the flexural stress dispersion structures 162A, 162B are arranged against and partially in direct contact with each other, but not in direct contact with the upper and lower substrates 150b, 150a. The first laminated substrate and the second laminated substrate may be joined together as the flexural stress dispersion structures 162A, 162B are connected without the adhesive layer. The details of the aforementioned features of the sidewall barrier structures or flexural stress dispersion structures may be referred to US patent publication No. 2014/268, 606 A1.

In the above embodiments, the upper and lower sides (i.e. the top and bottom laminated substrates) of the environmental-sensitive electronic components are equipped with the ultra-thin glass plates. However, depending on the packaging materials or electronic components, it is possible to have the ultra-thin glass plate(s) disposed on only one side of the electronic component(s). That is, the ultra-thin glass plate(s) is disposed in the top laminated substrate or the bottom laminated substrate.

Figure 5A:
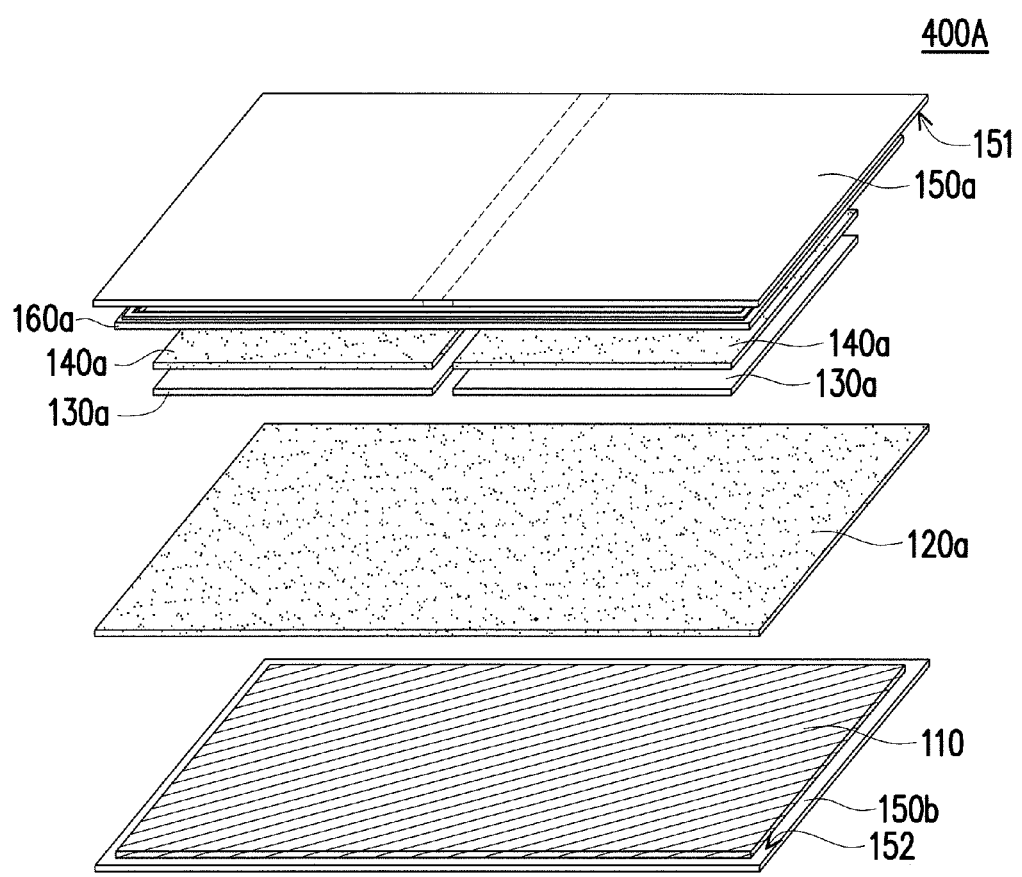
FIG. 5A is a schematic view of a foldable package structure according to one embodiment of the present disclosure.

FIG. 5A is a schematic view of a foldable package structure according to another embodiment of the present disclosure. FIG. 5A is a schematic exploded view of the foldable package structure before assembling the electronic component and the layers to be laminated together (the laminated layers). In FIG. 5A, the electronic component and the laminated layers are shown to be separated from one another. Referring to FIG. 5A, in the present embodiment, the foldable package structure 400A (from outermost to innermost) comprises the first and second substrates 150a, 150b, the first adhesive layer 140a, the first ultra-thin glass plates 130a, the second adhesive layer 120a and at least one environmental-sensitive electronic component 110. Compared with the foldable package structure 100 of the previous embodiment(s), the packaging materials or the laminated structure of the foldable package structure 400A in this embodiment are quite similar and the same reference numerals may be used to mark the same or similar parts. In this embodiment, the environmental-sensitive electronic component 110 is disposed directly on the top surface 152 of the second substrate 150b, devoid of the ultra-thin glass plate or the adhesive layer at the lower side of the environmental-sensitive electronic component 110. The foldable package structure 400A in this embodiment can be regarded as an example of the package structure with the bottom laminated substrate lacking the ultra-thin glass plate. The second substrate 150b may include a plastic barrier film, a metal foil barrier film, a glass fiber barrier film or a composite material barrier film, for better barrier effects. The sidewall barrier structure 160a is disposed on the first substrate 150a. After assembling and laminating the package structure, the sidewall barrier structure 160a surrounds the four sides of the environmental-sensitive electronic component 110 or the first ultra-thin glass plate 130a.

Figure 5B:
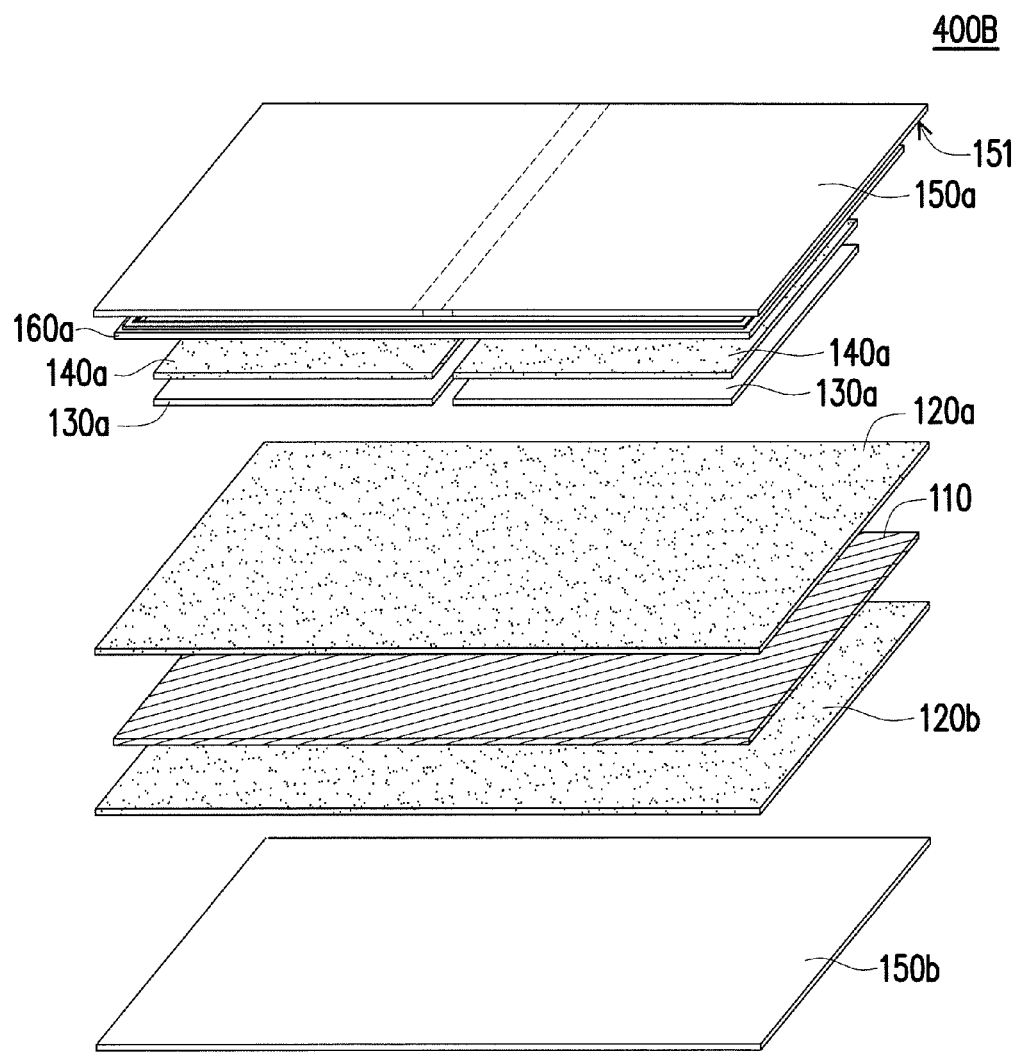
FIG. 5B is a schematic view of a foldable package structure according to one embodiment of the present disclosure.

FIG. 5B is a schematic view of a foldable package structure according to another embodiment of the present disclosure. FIG. 5B is a schematic exploded view of the foldable package structure before assembling the electronic component and the layers to be laminated together (the laminated layers). In FIG. 5B, the electronic component and the laminated layers are shown to be separated from one another. Referring to FIG. 5B, in the present embodiment, the foldable package structure 400B (from outermost to innermost) comprises the first and second substrates 150a, 150b, the first adhesive layer 140a, the first ultra-thin glass plate 130a, the second and third adhesive layers 120a, 120b and at least one environmental-sensitive electronic component 110. Compared with the foldable package structure 100 of the previous embodiment(s), the packaging materials or the laminated structure of the foldable package structure 400B in this embodiment are quite similar and the same reference numerals may be used to mark the same or similar parts. In this embodiment, the environmental-sensitive electronic component 110 is sandwiched between the second and third adhesive layers 120a, 120b and then attached to the second substrate 150b, devoid of the ultra-thin glass plate at the lower side of the environmental-sensitive electronic component 110. The second substrate 150b may include a plastic barrier film, a metal foil barrier film, a glass fiber barrier film or a composite material barrier film, for better barrier effects. The sidewall barrier structure 160a is disposed on the first substrate 150a. After assembling and laminating the package structure, the sidewall barrier structure 160a surrounds the sides of the first ultra-thin glass plate 130a.

Figure 5C:
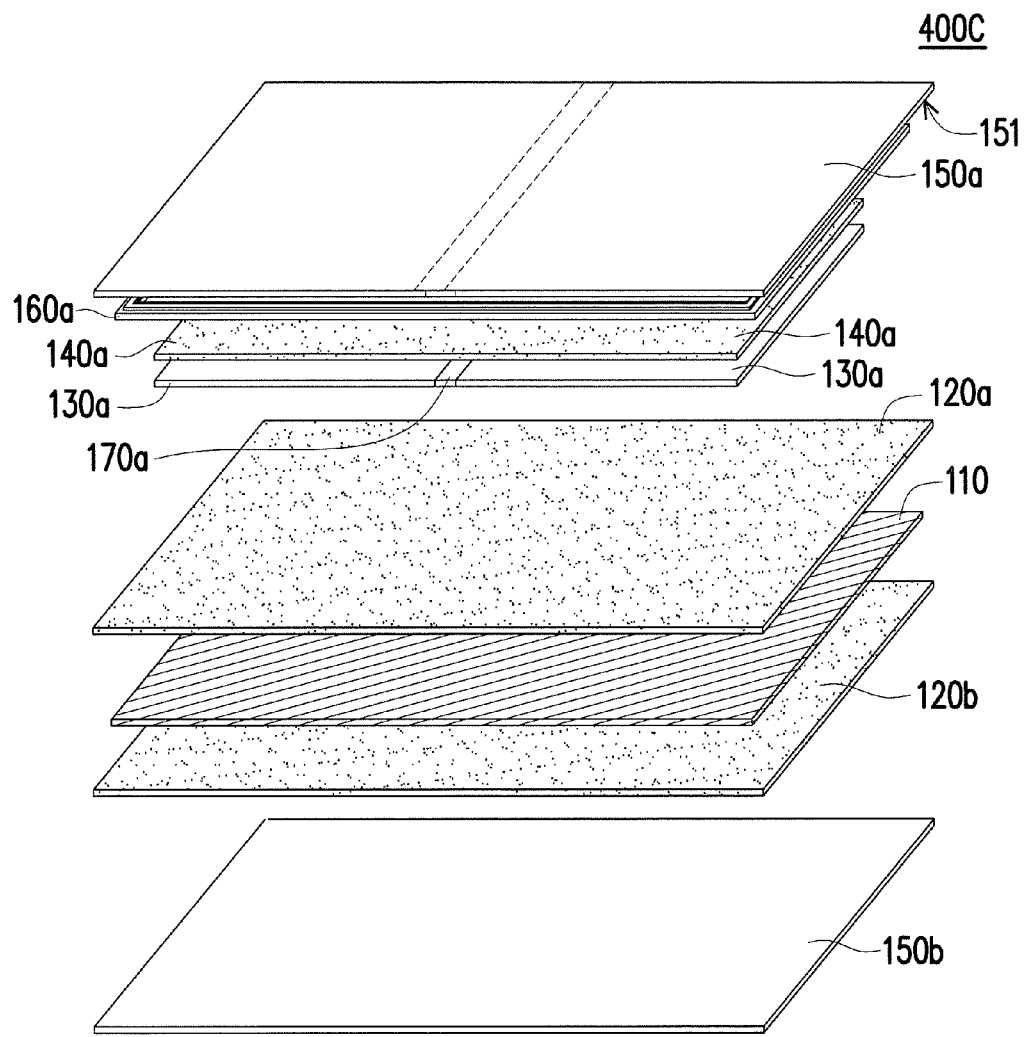
FIG. 5C is a schematic view of a foldable package structure according to one embodiment of the present disclosure.

FIG. 5C is a schematic view of a foldable package structure according to another embodiment of the present disclosure. FIG. 5C is a schematic exploded view of the foldable package structure before assembling the electronic component and the layers to be laminated together (the laminated layers). In FIG. 5C, the electronic component and the laminated layers are shown to be separated from one another. Referring to FIG. 5C, in the present embodiment, the foldable package structure 400C (from outermost to innermost) comprises the first and second substrates 150a, 150b, the first adhesive layer 140a, the first ultra-thin glass plate 130a, the second and third adhesive layers 120a, 120b and at least one environmental-sensitive electronic component 110. Compared with the foldable package structure 100 of the previous embodiment(s), the packaging materials or the laminated structure of the foldable package structure 400C in this embodiment are quite similar and the same reference numerals may be used to mark the same or similar parts.

In this embodiment, the environmental-sensitive electronic component 110 is sandwiched between the second and third adhesive layers 120a, 120b and then attached to the second substrate 150b through the third adhesive layer 120b, devoid of the ultra-thin glass plate at the lower side of the environmental-sensitive electronic component 110. The second substrate 150b may include a plastic barrier film, a metal foil barrier film, a glass fiber barrier film or a composite material barrier film, for better barrier effects.

Referring to FIG. 5C, the foldable package structure 400C further comprises the reinforced barrier layer 170a disposed at the location corresponding to the predetermined folded region. The reinforced barrier layer 170a is disposed between the two pieces of the first ultra-thin glass plate 130a and sandwiched between the first adhesive layer 140a and the second adhesive layer 120a. When being folded, even without the first ultra-thin glass plate 130a, the reinforced barrier layer 170a can further strengthen the moisture barrier and protect the environmental-sensitive electronic component 110 from the damages of the environmental factors. The sidewall barrier structure 160a is disposed on the first substrate 150a. After assembling and laminating the package structure, the sidewall barrier structure 160a surrounds the sides of the first ultra-thin glass plate 130a. Similarly, the foldable package structure 400A of FIG. 5A may also include the reinforced barrier layer 170a at the predetermined folded region. The reinforced barrier layer 170a is disposed between the two sheets of the first ultra-thin glass plate 130a and sandwiched between the first adhesive layer 140a and the second adhesive layer 120a.

Figure 6:
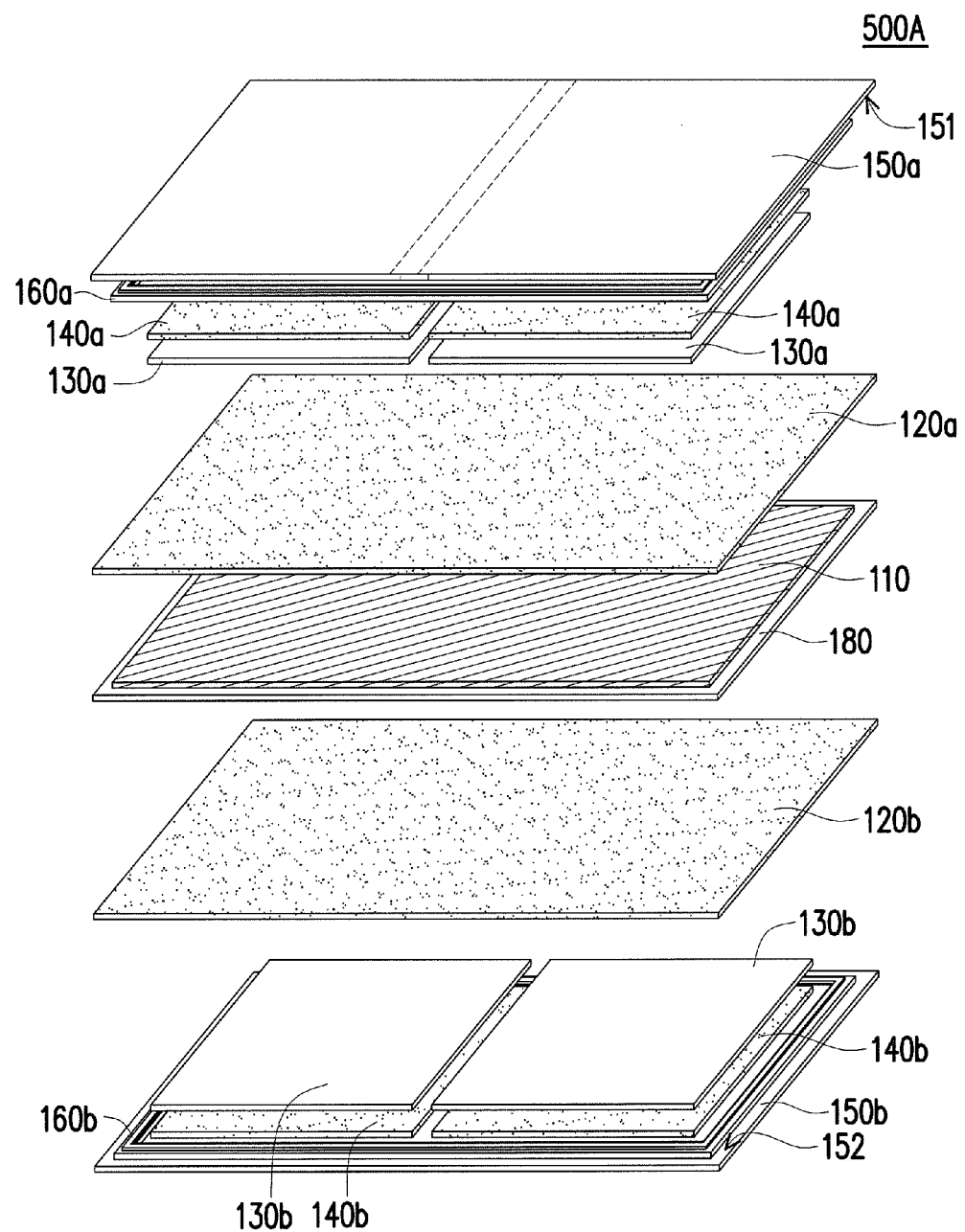
FIG. 6 is a schematic view of a foldable package structure according to one embodiment of the present disclosure.

FIG. 6 is a schematic view of a foldable package structure according to another embodiment of the present disclosure. FIG. 6 is a schematic exploded view of the foldable package structure before assembling the electronic component and the layers to be laminated together (the laminated layers). In FIG. 6, the electronic component and the laminated layers are shown to be separated from one another. Referring to FIG. 6, in the present embodiment, the foldable package structure 500A (from outermost to innermost) comprises the first and second substrates 150a, 150b, the first and fourth adhesive layers 140a, 140b, the first and second ultra-thin glass plates 130a, 130b, the second and third adhesive layers 120a, 120b and at least one environmental-sensitive electronic component 110. Compared with the foldable package structure 100 of the previous embodiment(s), the packaging materials or the laminated structure of the foldable package structure 500A in this embodiment are quite similar and the same reference numerals may be used to mark the same or similar parts. In this embodiment, the environmental-sensitive electronic component 110 is disposed directly on the intermediate barrier layer 180, and then laminated with the first and second ultra-thin glass plates 130a, 130b through the second and third adhesive layers 120a, 120b. The intermediate barrier layer 180 may include a plastic barrier film, a metal foil barrier film, a glass fiber barrier film or a composite material barrier film, for better barrier effects. The first and second substrates 150a, 150b are laminated to the first and second ultra-thin glass plates 130a, 130b through the first and fourth adhesive layers 140a, 140b, and the environmental-sensitive electronic component 110 and the intermediate barrier layer 180 are sandwiched in-between. The sidewall barrier structures 160a, 160b are respectively disposed on the opposite surfaces of the first and second substrates 150a, 150b. After assembling and laminating the package structure, the sidewall barrier structures 160a, 160b surround the four sides of the environmental-sensitive electronic component 110 or the first and second ultra-thin glass plates 130a, 130b. Herein, the intermediate barrier layer 180 and the sidewall barrier structures 160a, 160b further enhance the moisture barrier effects.

Figure 7:
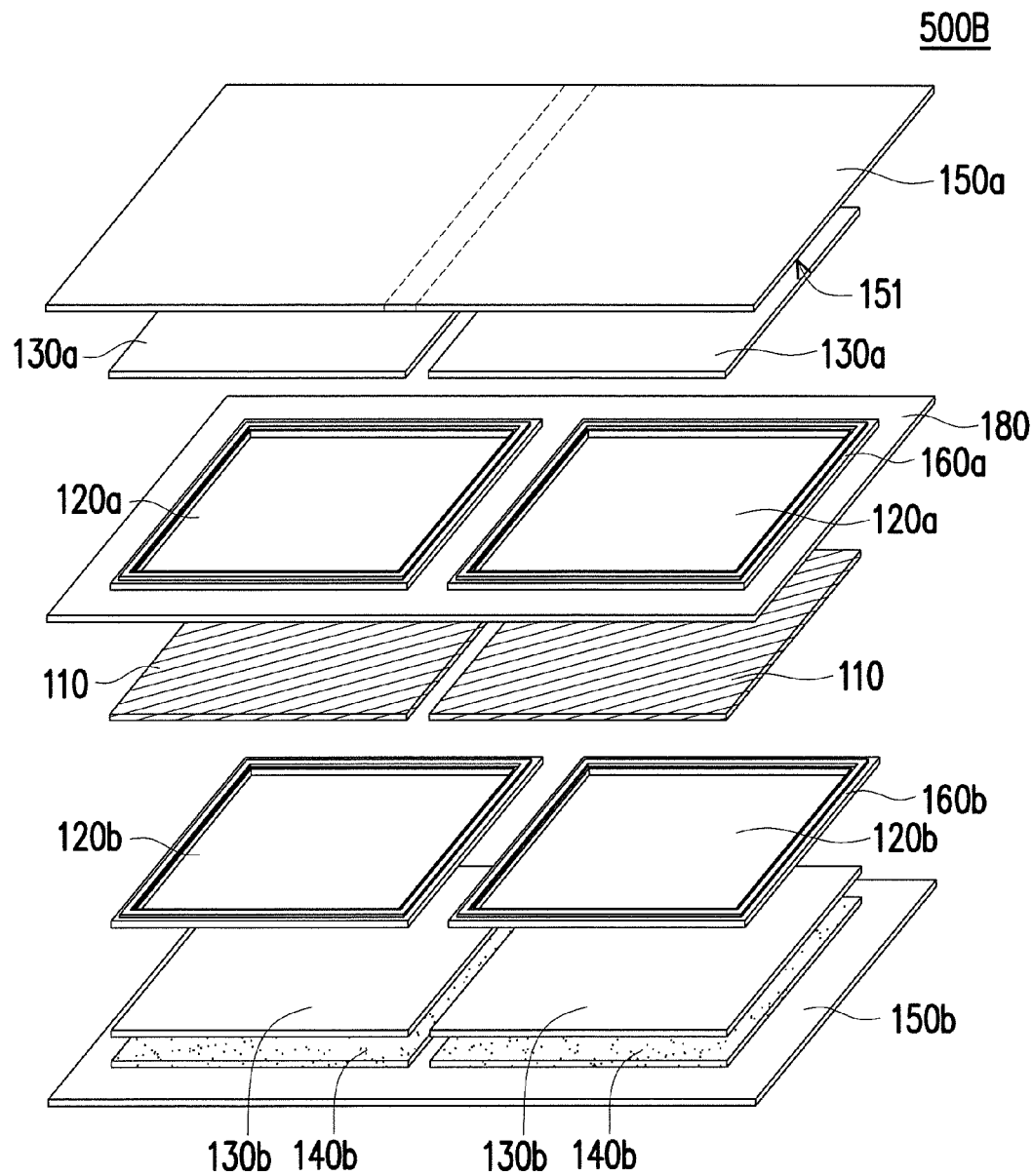
FIG. 7 is a schematic view of a foldable package structure according to one embodiment of the present disclosure.

FIG. 7 is a schematic view of a foldable package structure according to another embodiment of the present disclosure. FIG. 7 is a schematic exploded view of the foldable package structure before assembling the electronic component and the layers to be laminated together (the laminated layers). In FIG. 7, the electronic component and the laminated layers are shown to be separated from one another. Referring to FIG. 7, in the present embodiment, the foldable package structure 500B (from outermost to innermost) comprises the first and second substrates 150a, 150b, the fourth adhesive layer 140b, the first and second ultra-thin glass plates 130a, 130b, the second and third adhesive layers 120a, 120b and two environmental-sensitive electronic components 110. Compared with the foldable package structure 100 of the previous embodiment(s), the packaging materials or the laminated structure of the foldable package structure 500B in this embodiment are quite similar and the same reference numerals may be used to mark the same or similar parts. In this embodiment, the environmental-sensitive electronic components 110 are disposed directly on the intermediate barrier layer 180, and then laminated with the first and second ultra-thin glass plates 130a, 130b through the second and third adhesive layers 120a, 120b. The first and second substrates 150a, 150b are laminated to the first and second ultra-thin glass plates 130a, 130b through the second and fourth adhesive layers 120a, 140b, and the environmental-sensitive electronic components 110 and the intermediate barrier layer 180 are sandwiched in-between. Corresponding to the two environmental-sensitive electronic components 110, either of the first and second ultra-thin glass plates 130a, 130b and the second, third and fourth adhesive layers 120a, 120b, 140b is designed to be two pieces. The sidewall barrier structures 160a, 160b are respectively disposed on the opposite surfaces of the second and third adhesive layers 120a, 120b. After assembling and laminating the package structure, the sidewall barrier structures 160a surround the four sides of the two pieces of the first ultra-thin glass plate 130a, while the sidewall barrier structures 160b surround the four sides of the environmental-sensitive electronic components 110. Herein, the intermediate barrier layer 180 and the sidewall barrier structures 160a, 160b further enhance the moisture barrier effects.

Figure 8:
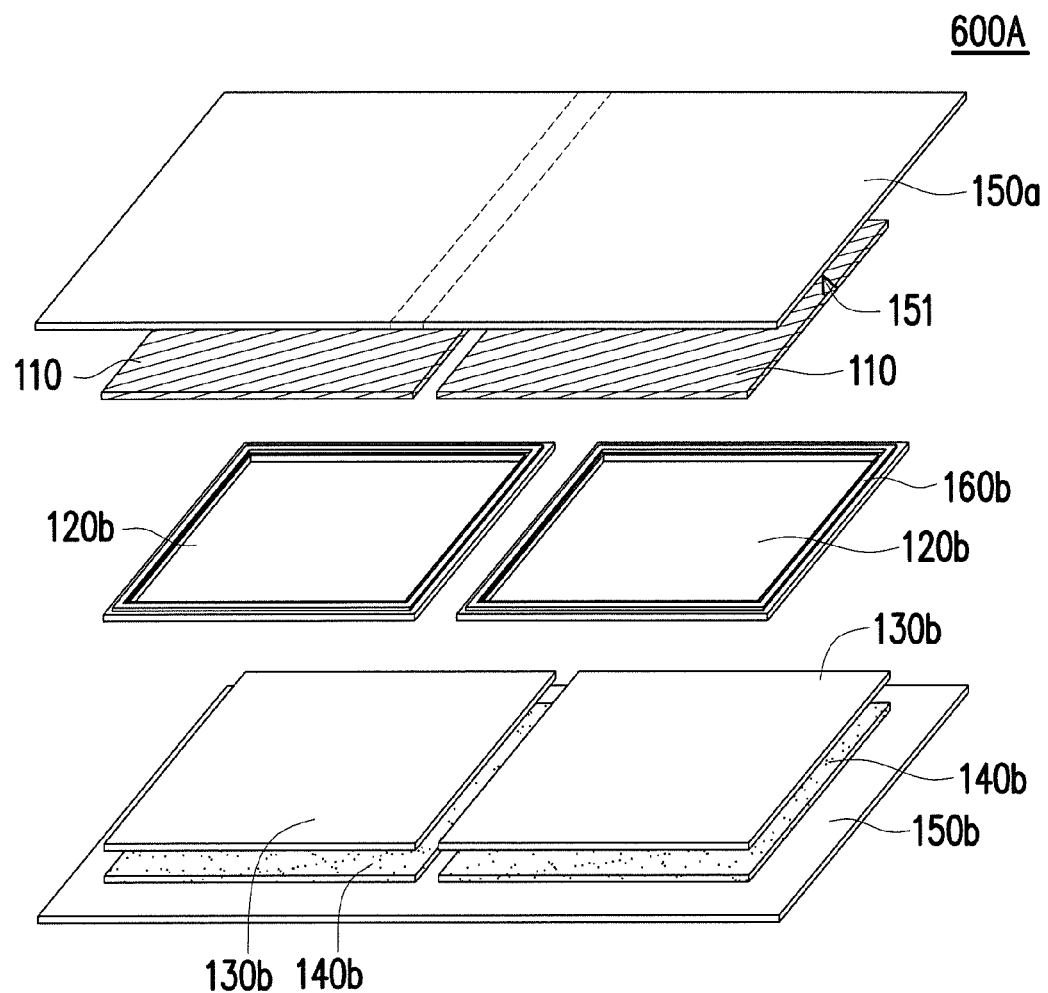
FIG. 8 is a schematic view of a foldable package structure according to one embodiment of the present disclosure.

FIG. 8 is a schematic view of a foldable package structure according to another embodiment of the present disclosure. FIG. 8 is a schematic exploded view of the foldable package structure before assembling the electronic component and the layers to be laminated together (the laminated layers). In FIG. 8, the electronic component and the laminated layers are shown to be separated from one another. Referring to FIG. 8, in the present embodiment, the foldable package structure 600A (from outermost to innermost) comprises the first and second substrates 150a, 150b, two environmental-sensitive electronic components 110, the fourth adhesive layer 140b, the second ultra-thin glass plate 130b, and the third adhesive layer 120b. Compared with the foldable package structure 100 of the previous embodiment(s), the packaging materials or the laminated structure of the foldable package structure 600A in this embodiment are quite similar and the same reference numerals may be used to mark the same or similar parts. In this embodiment, the environmental-sensitive electronic components 110 may be the same or different electronic components and are disposed directly on the lower surface 151 of the first substrate 150a, devoid of the ultra-thin glass plate or the adhesive layer at the upper side of the environmental-sensitive electronic component 110. The foldable package structure 600A in this embodiment can be regarded as an example of the package structure with the top laminated substrate lacking the ultra-thin glass plate. The first substrate 150a may include a plastic barrier film, a metal foil barrier film, a glass fiber barrier film or a composite material barrier film, for better barrier effects. The two separate environmental-sensitive electronic components 110 are arranged apart and respectively at two opposite sides of the predetermined folded region of the foldable package structure 600A, thus keeping away from the predetermined folded region of the foldable package structure 600A. The dotted line in the figure marks the predetermined folded region, and the two opposite sides of the dotted line represents the predetermined non-folded regions. Corresponding to the two environmental-sensitive electronic components 110, either of the second ultra-thin glass plate 130b and the third and fourth adhesive layers 120b, 140b is designed to be two pieces. Accordingly, the first and second substrates 150a, 150b are laminated with the two pieces of the second ultra-thin glass plate 130b and the two environmental-sensitive electronic components 110. The sidewall barrier structures 160b are respectively disposed on the two pieces of the third adhesive layer 120b. After assembling and laminating the package structure, the sidewall barrier structures 160b surround the four sides of the two environmental-sensitive electronic components 110, further enhancing the moisture barrier effects.

In the foregoing embodiments, the environmental-sensitive electronic components are arranged at both sides of the predetermined folded region of the foldable package structures. However, depending on the packaging materials or the electronic component(s) used, it is possible to arrange the environmental-sensitive electronic component(s) at only one side of the predetermined folded region, while the non-environmentally sensitive electronic components are arranged at the other side of the predetermined folded region.

Figure 9:
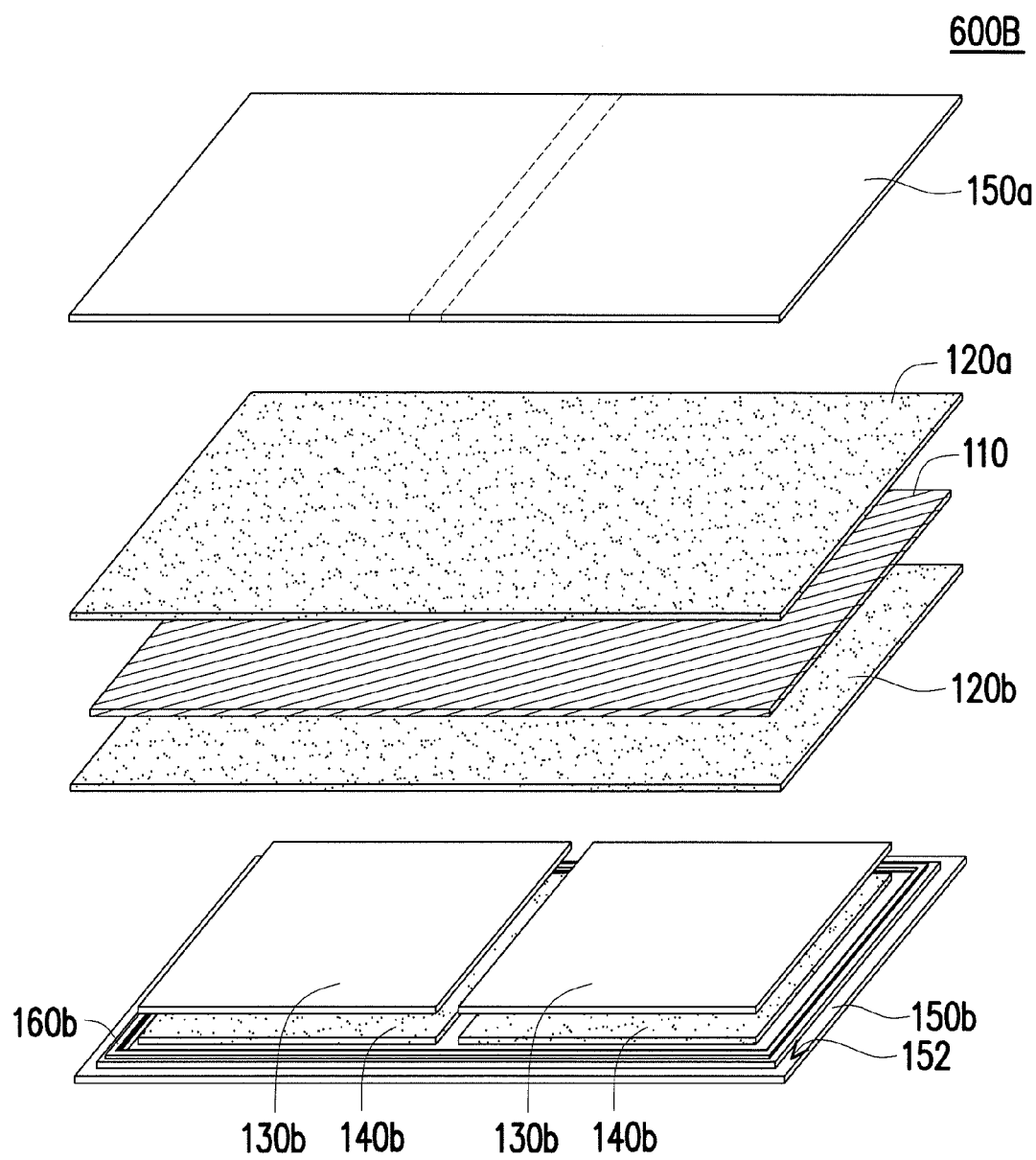
FIG. 9 is a schematic view of a foldable package structure according to one embodiment of the present disclosure.

FIG. 9 is a schematic view of a foldable package structure according to another embodiment of the present disclosure. FIG. 9 is a schematic exploded view of the foldable package structure before assembling the electronic component and the layers to be laminated together (the laminated layers). In FIG. 9, the electronic component and the laminated layers are shown to be separated from one another. Referring to FIG. 9, in the present embodiment, the foldable package structure 600B (from outermost to innermost) comprises the first and second substrates 150a, 150b, the environmental-sensitive electronic component 110, the fourth adhesive layer 140b, the second ultra-thin glass plate 130b, and the second and third adhesive layers 120a, 120b. Compared with the foldable package structure 100 of the previous embodiment(s), the packaging materials or the laminated structure of the foldable package structure 600B in this embodiment are quite similar and the same reference numerals may be used to mark the same or similar parts. In this embodiment, the environmental-sensitive electronic component 110 is sandwiched between the second and third adhesive layers 120a, 120b and laminated to the lower surface 151 of the first substrate 150a through the second adhesive layer 120a, devoid of the ultra-thin glass plate at the upper side of the environmental-sensitive electronic component 110. The foldable package structure 600B in this embodiment can be regarded as an example of the package structure with the top laminated substrate lacking the ultra-thin glass plate. The first substrate 150a may include a plastic barrier film, a metal foil barrier film, a glass fiber barrier film or a composite material barrier film, for better barrier effects. Either of the second ultra-thin glass plate 130b and the fourth adhesive layer 140b is designed to be two pieces. The sidewall barrier structure 160b is disposed on the upper surface of the second substrate 150b. After assembling and laminating the package structure, the sidewall barrier structure 160b surrounds the four sides of the environmental-sensitive electronic component 110 and surrounds the separate pieces of the second ultra-thin glass plate 130b and the fourth adhesive layer 140b, further enhancing the moisture barrier effects.

Figure 10:
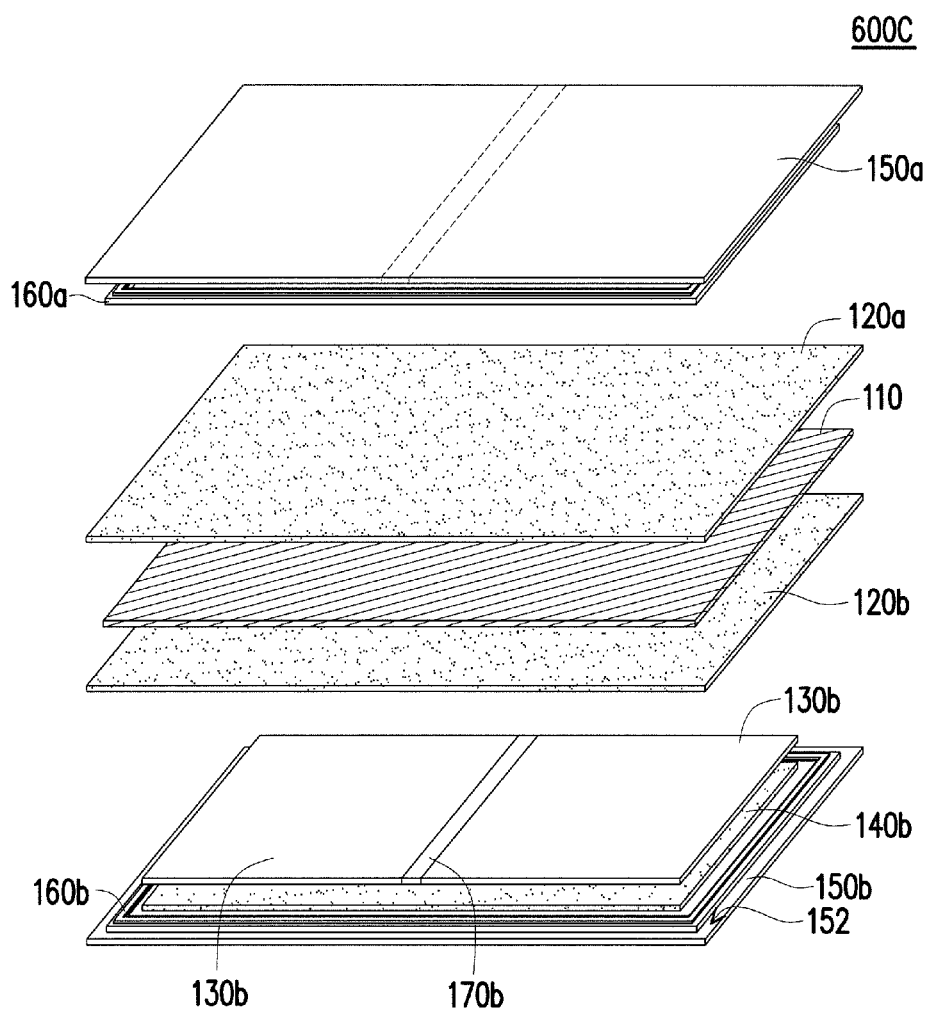
FIG. 10 is a schematic view of a foldable package structure according to one embodiment of the present disclosure.

FIG. 10 is a schematic view of a foldable package structure according to another embodiment of the present disclosure. FIG. 10 is a schematic exploded view of the foldable package structure before assembling the electronic component and the layers to be laminated together (the laminated layers). In FIG. 10, the electronic component and the laminated layers are shown to be separated from one another. Referring to FIG. 10, in the present embodiment, the foldable package structure 600C (from outermost to innermost) comprises the first and second substrates 150a, 150b, the environmental-sensitive electronic component 110, the fourth adhesive layer 140b, the second ultra-thin glass plate 130b, and the second and third adhesive layers 120a, 120b. Compared with the foldable package structure 100 of the previous embodiment(s), the packaging materials or the laminated structure of the foldable package structure 600C in this embodiment are quite similar and the same reference numerals may be used to mark the same or similar parts. In this embodiment, as the top laminated substrate of the foldable package structure 600C lacks the ultra-thin glass plate, the environmental-sensitive electronic component 110 is sandwiched between the second and third adhesive layers 120a, 120b and laminated to the lower surface 151 of the first substrate 150a through the second adhesive layer 120a. The first substrate 150a may include a plastic barrier film, a metal foil barrier film, a glass fiber barrier film or a composite material barrier film, for better barrier effects. The second ultra-thin glass plate 130b is designed to be two pieces. The foldable package structure 600C further comprises the reinforced barrier layer 170b between the two pieces of the second ultra-thin glass plate 130b and disposed at the locations corresponding to the predetermined folded region. The reinforced barrier layer 170b is disposed between the two pieces of the second ultra-thin glass plate 130b and sandwiched between the fourth and the third adhesive layers 140b, 120b. Since the second ultra-thin glass plate 130b is not located at the folded region, the reinforced barrier layer 170b can provide further moisture barrier and protect the environmental-sensitive electronic component 110 from being damaged by environmental factors. The sidewall barrier structures 160a, 160b are respectively disposed on the opposite surfaces of the first and second substrates 150a, 150b. After assembling and laminating the package structure, the sidewall barrier structure 160a surrounds the four sides of the environmental-sensitive electronic component 110, while the sidewall barrier structure 160b surrounds the separate pieces of the second ultra-thin glass plate 130b and the fourth adhesive layer 140b, further enhancing the moisture barrier effects.

Figure 11:
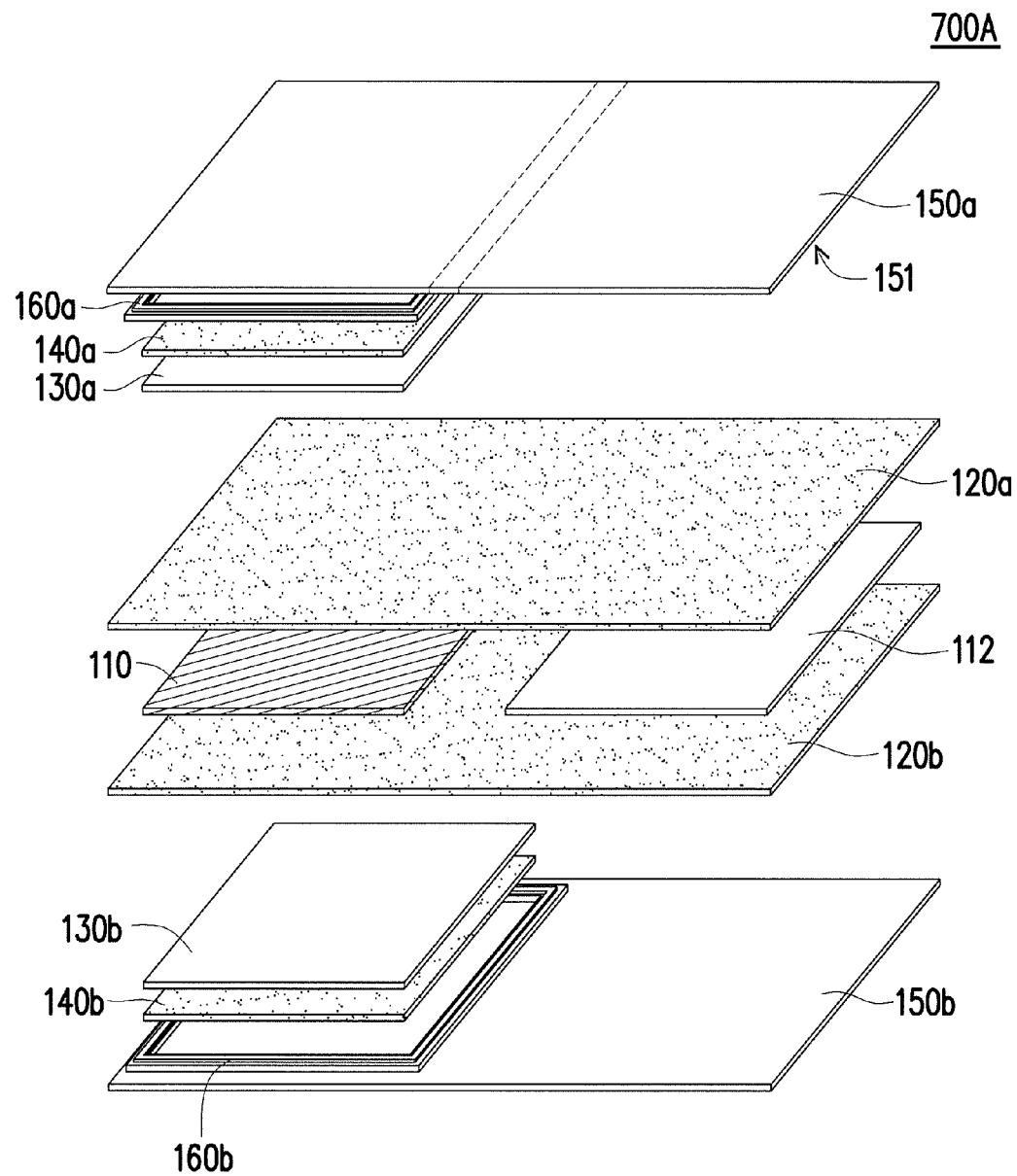
FIG. 11 is a schematic view of a foldable package structure according to one embodiment of the present disclosure.

FIG. 11 is a schematic view of a foldable package structure according to another embodiment of the present disclosure. FIG. 11 is a schematic exploded view of the foldable package structure before assembling the electronic component and the layers to be laminated together (the laminated layers). In FIG. 11, the electronic component and the laminated layers are shown to be separated from one another. Referring to FIG. 11, in the present embodiment, the foldable package structure 700A (from outermost to innermost) comprises the first and second substrates 150a, 150b, the first and fourth adhesive layers 140a, 140b, the first and second ultra-thin glass plates 130a, 130b, the second and third adhesive layers 120a, 120b, one environmental-sensitive electronic component 110, and the other electronic component 112. The other electronic component 112 is different from the environmental-sensitive electronic component 110. The other electronic component 112 may be a non-environmentally sensitive electronic component or another kind of environmental-sensitive electronic components less demanding about moisture barrier when compared with the environmental-sensitive electronic component 110. For example, the environmental-sensitive electronic component 110 may be an OLED element requiring the water vapour transmission rate (WVTR) less than $10^{-6}$ (g/m²/day), while the other electronic component 112 may be the electrophoretic display (EPD) element requiring the water vapour transmission rate (WVTR) less than $10^{-2}$ (g/m²/day).

Compared with the foldable package structure 100 of the previous embodiment(s), the packaging materials or the laminated structure of the foldable package structure 700A of FIG. 11 are quite similar and the same reference numerals may be used to mark the same or similar parts. In this embodiment, the environmental-sensitive electronic component 110 is disposed at only one side of the predetermined folded region of the foldable package structure 700A, while the other electronic component 112 is disposed at the other side of the predetermined folded region. Accordingly, the laminated layer corresponding to the environmental-sensitive electronic component 110 and the other electronic component 112 arranged at two different sides of the predetermined folded region will not be the same. Corresponding to the side with the environmental-sensitive electronic component 110, the environmental-sensitive electronic component 110 is sandwiched by the first and second ultra-thin glass plates 130a, 130b through the second and third adhesive layers 120a, 120b, and the first and second substrates 150a, 150b are laminated to the first and second ultra-thin glass plates 130a, 130b through the first and fourth adhesive layers 140a, 140b. Corresponding to the side with the environmental-sensitive electronic component 110, the sidewall barrier structures 160a, 160b are respectively disposed on the opposite surfaces of the first and second substrates 150a, 150b. When the foldable package structure is laminated and assembled together, the sidewall barrier structures 160a, 160b surround the four sides of the environmental-sensitive electronic component 110, thus enhancing the moisture barrier effect. However, corresponding to the other side with the other electronic component 112, the other electronic components 112 is sandwiched between the second and third adhesive layer 120a, 120b and the first and second substrates 150a, 150b are directly laminated to the second and third adhesive layers 120a, 120b. That is, corresponding to the other side with the other electronic component 112, the ultra-thin glass plate, the adhesive layer(s) or the sidewall barrier structure is omitted. As the ultra-thin glass plate is omitted in certain region, the first and second substrates 150a, 150b may include a plastic barrier film, a metal foil barrier film, a glass fiber barrier film, or a composite material barrier film, so as to provide a moisture barrier effect. In this embodiment, the span and locations of the sidewall barrier structures 160a, 160b only correspond to the location of the environmental-sensitive electronic component 110, but do not extend to correspond to the location of the other electronic component 112.

Figure 12:
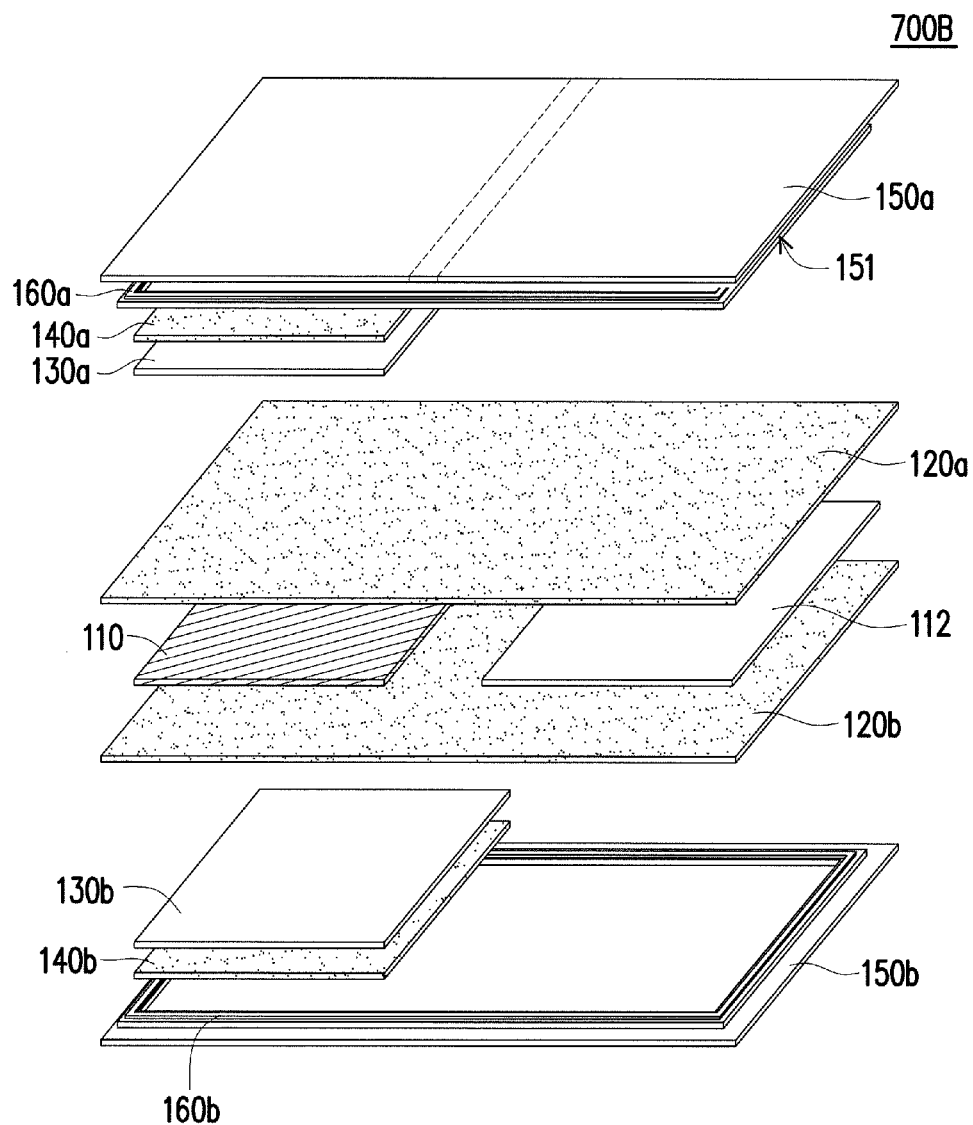
FIG. 12 is a schematic view of a foldable package structure according to one embodiment of the present disclosure.

FIG. 12 is a schematic view of a foldable package structure according to another embodiment of the present disclosure. FIG. 12 is a schematic exploded view of the foldable package structure before assembling the electronic component and the layers to be laminated together (the laminated layers). In FIG. 12, the electronic component and the laminated layers are shown to be separated from one another. In this embodiment, the environmental-sensitive electronic component 110 is disposed at only one side of the predetermined folded region of the foldable package structure 700B, while the other electronic component 112 is disposed at the other side of the predetermined folded region. Accordingly, the laminated layer corresponding to the environmental-sensitive electronic component 110 and the other electronic component 112 arranged at two different sides of the predetermined folded region will not be the same. The sidewall barrier structures 160a, 160b are respectively disposed on the opposite surfaces of the first and second substrates 150a, 150b. When the foldable package structure is laminated and assembled together, the sidewall barrier structures 160a, 160b surround the environmental-sensitive electronic component 110 as well as the other electronic component 112, thus enhancing the moisture barrier effect. That is, as shown in FIG. 12, the span and locations of the sidewall barrier structures 160a, 160b correspond to the locations of both of the environmental-sensitive electronic component 110 and the other electronic component 112. The configurations and locations of the sidewall barrier structures may be modified depending on the product requirements and the scope of the present disclosure is not limited thereto.

Figure 13:
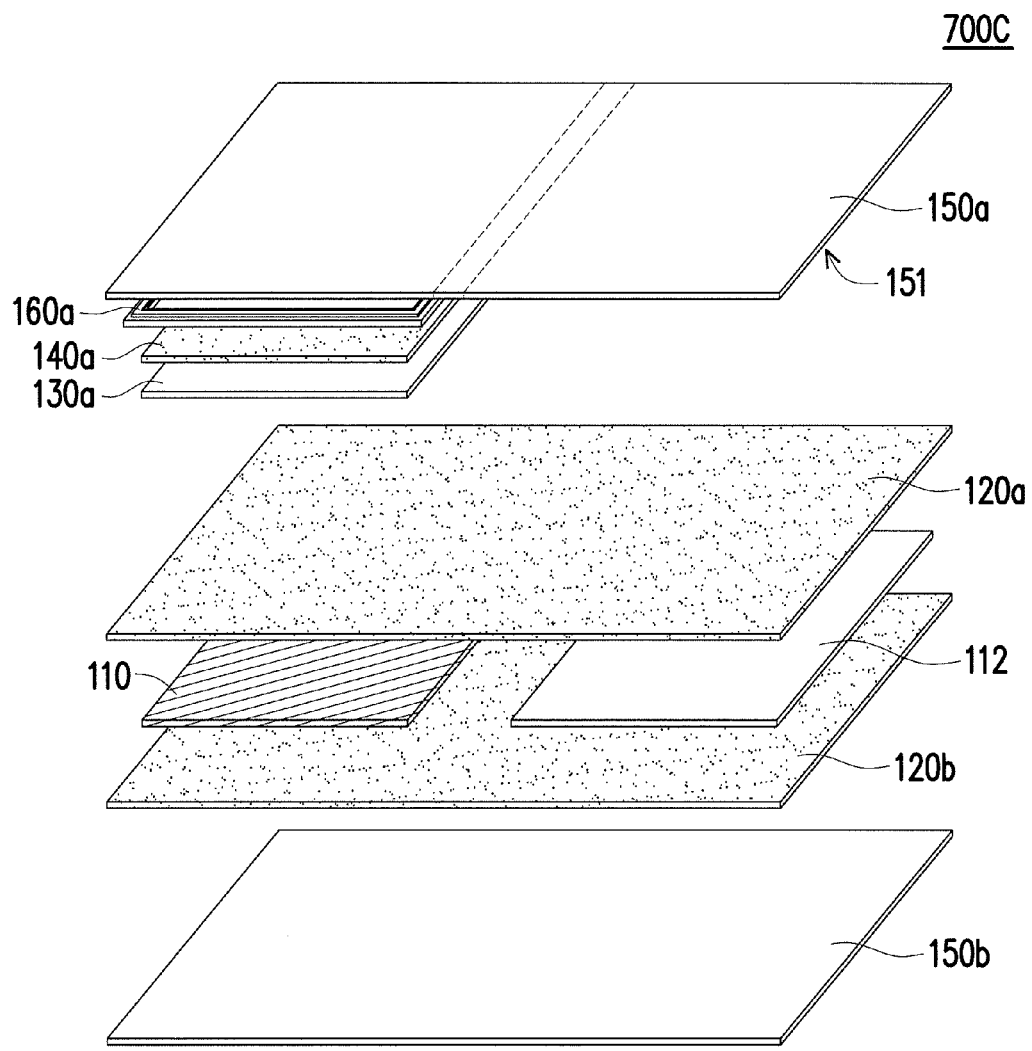
FIG. 13 is a schematic view of a foldable package structure according to one embodiment of the present disclosure.

FIG. 13 is a schematic view of a foldable package structure according to another embodiment of the present disclosure. FIG. 13 is a schematic exploded view of the foldable package structure before assembling the electronic component and the layers to be laminated together (the laminated layers). In FIG. 13, the electronic component and the laminated layers are shown to be separated from one another. Referring to FIG. 13, in the present embodiment, the foldable package structure 700C (from outermost to innermost) comprises the first and second substrates 150a, 150b, the first adhesive layer 140a, the first ultra-thin glass plate 130a, the second and third adhesive layers 120a, 120b, one environmental-sensitive electronic component 110, and the other electronic component 112. The other electronic component 112 is different from the environmental-sensitive electronic component 110. The other electronic component 112 may be a non-environmentally sensitive electronic component or another kind of environmental-sensitive electronic components less demanding about moisture barrier when compared with the environmental-sensitive electronic component 110. For example, the environmental-sensitive electronic component 110 may be an OLED element requiring the water vapour transmission rate (WVTR) less than $10^{-6}$ (g/m$^2$/day), while the other electronic component 112 may be the electrophoretic display (EPD) element requiring the water vapour transmission rate (WVTR) less than $10^{-2}$ (g/m$^2$/day). In this embodiment, the environmental-sensitive electronic component 110 is disposed at only one side of the predetermined folded region of the foldable package structure 700C, while the other electronic component 112 is disposed at the other side of the predetermined folded region. Accordingly, the laminated layer corresponding to the environmental-sensitive electronic component 110 and the other electronic component 112 arranged at two different sides of the predetermined folded region will not be the same. Corresponding to the side with the environmental-sensitive electronic component 110, the environmental-sensitive electronic component 110 is sandwiched by the first ultra-thin glass plate 130a and the second substrate 150b through the second and third adhesive layers 120a, 120b, and the first and second substrates 150a, 150b sandwich the environmental-sensitive electronic component 110 through the first ultra-thin glass plate 130a and the first adhesive layer 140a. Corresponding to the side with the environmental-sensitive electronic component 110, the sidewall barrier structure 160a is disposed on the surface of the first substrate 150a. When the foldable package structure is laminated and assembled together, the sidewall barrier structure 160a surrounds the four sides of the environmental-sensitive electronic component 110, thus enhancing the moisture barrier effect. However, corresponding to the other side with the other electronic component 112, the other electronic components 112 is sandwiched between the second and third adhesive layer 120a, 120b and the first and second substrates 150a, 150b are directly laminated to the second and third adhesive layers 120a, 120b. That is, corresponding to the other side with the other electronic component 112, the ultra-thin glass plate, the adhesive layer(s) or the sidewall barrier structure is omitted. As the ultra-thin glass plate is omitted in certain region, the first and second substrates 150a, 150b may include a plastic barrier film, a metal foil barrier film, a glass fiber barrier film, or a composite material barrier film, so as to provide a moisture barrier effect. In this embodiment, the span and location of the sidewall barrier structure 160a only correspond to the location of the environmental-sensitive electronic component 110, but do not extend to correspond to the location of the other electronic component 112.

Figure 14:
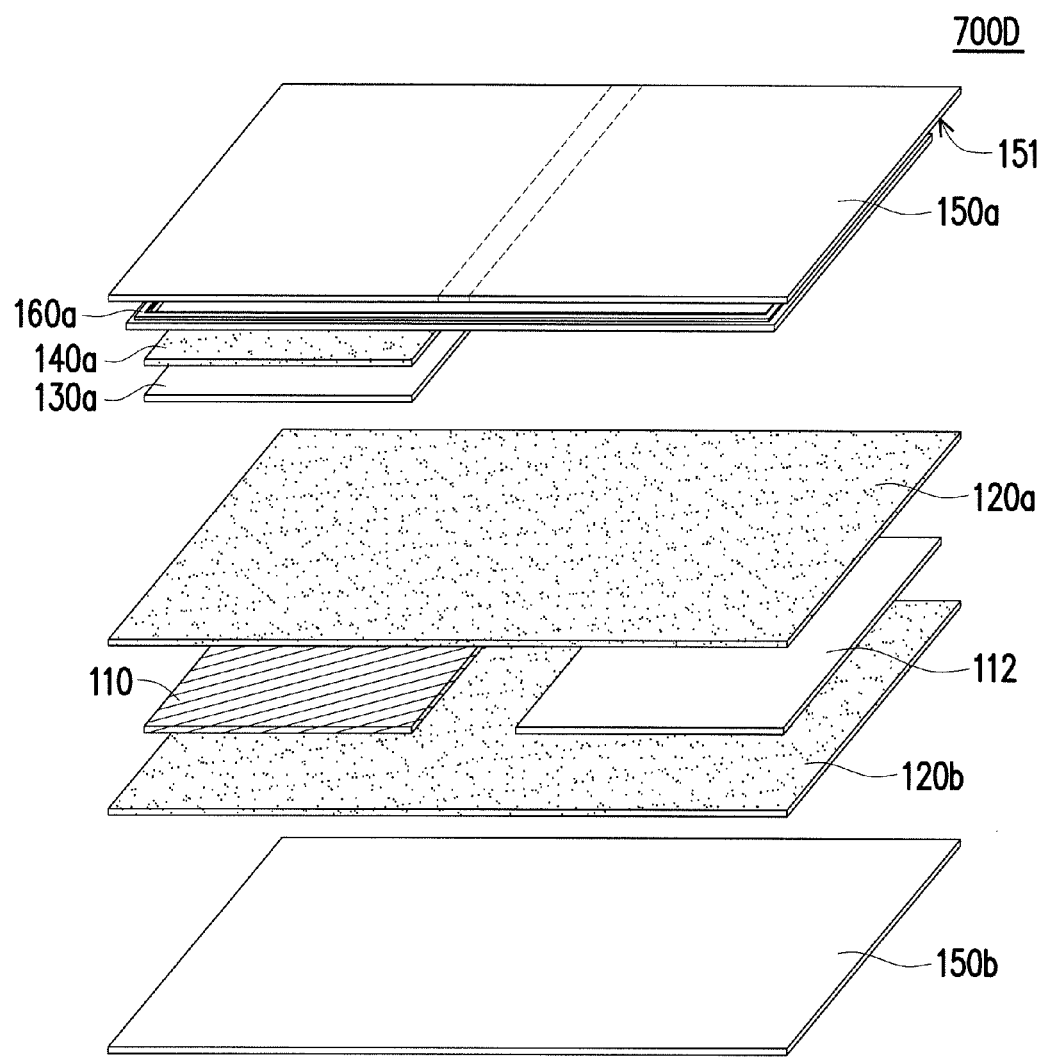
FIG. 14 is a schematic view of a foldable package structure according to one embodiment of the present disclosure.

FIG. 14 is a schematic view of a foldable package structure according to another embodiment of the present disclosure. FIG. 14 is a schematic exploded view of the foldable package structure before assembling the electronic component and the layers to be laminated together (the laminated layers). In FIG. 14, the electronic component and the laminated layers are shown to be separated from one another. In this embodiment, the environmental-sensitive electronic component 110 is disposed at only one side of the predetermined folded region of the foldable package structure 700D, while the other electronic component 112 is disposed at the other side of the predetermined folded region. Accordingly, the laminated layer corresponding to the environmental-sensitive electronic component 110 and the other electronic component 112 arranged at two different sides of the predetermined folded region will not be the same. The sidewall barrier structure 160a is disposed on the surface of the first substrate 150a. When the foldable package structure is laminated and assembled together, the sidewall barrier structure 160a surrounds the environmental-sensitive electronic component 110 as well as the other electronic component 112, thus enhancing the moisture barrier effect. That is, as shown in FIG. 14, the span and location of the sidewall barrier structure 160a correspond to the locations of both of the environmental-sensitive electronic component 110 and the other electronic component 112.

Figure 15:
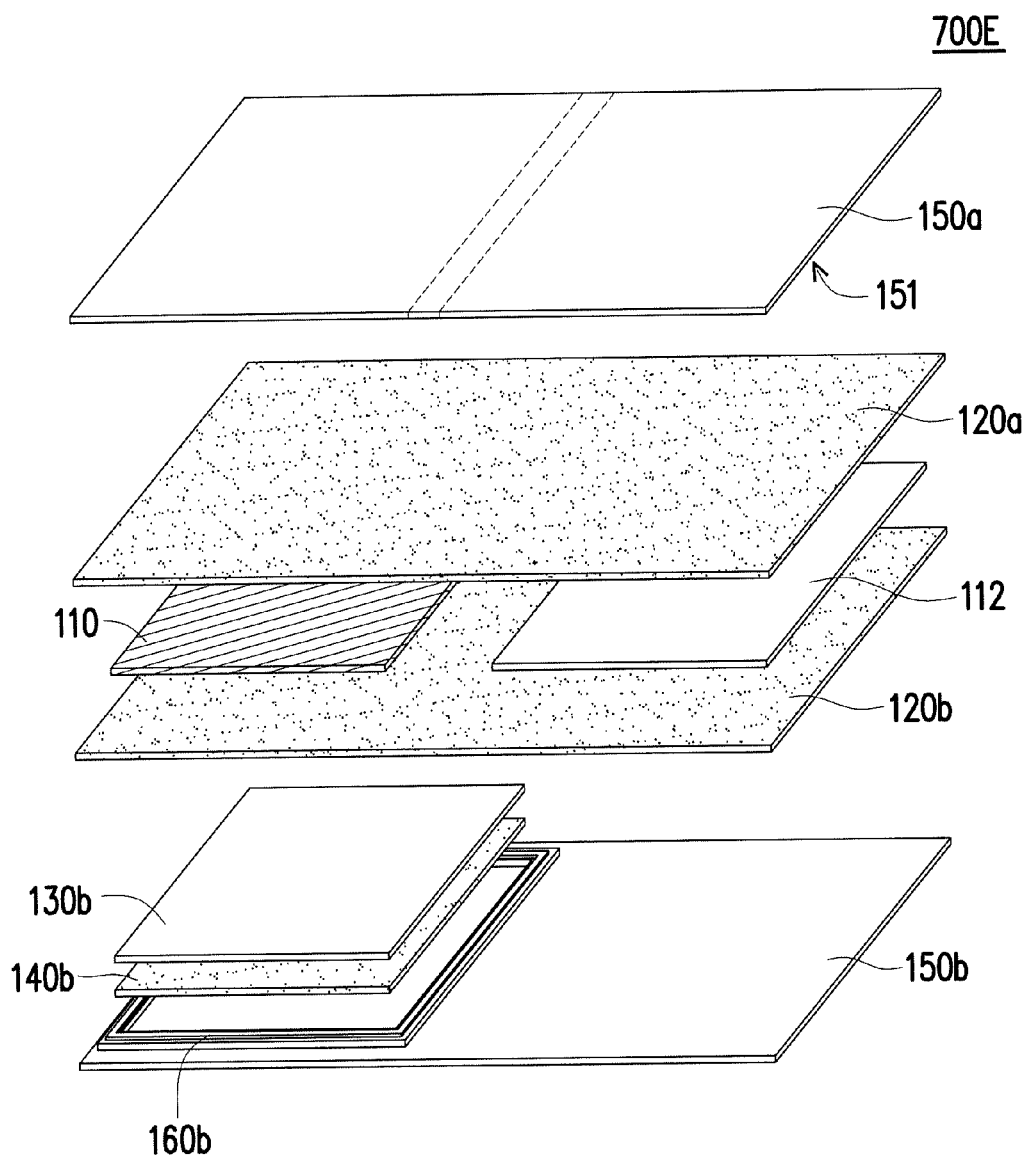
FIG. 15 is a schematic view of a foldable package structure according to one embodiment of the present disclosure.

FIG. 15 is a schematic view of a foldable package structure according to another embodiment of the present disclosure. FIG. 15 is a schematic exploded view of the foldable package structure before assembling the electronic component and the layers to be laminated together (the laminated layers). In FIG. 15, the electronic component and the laminated layers are shown to be separated from one another. Referring to FIG. 15, in the present embodiment, the foldable package structure 700E (from outermost to innermost) comprises the first and second substrates 150a, 150b, the fourth adhesive layer 140b, the second ultra-thin glass plate 130b, the second and third adhesive layers 120a, 120b, one environmental-sensitive electronic component 110, and the other electronic component 112. The other electronic component 112 is different from the environmental-sensitive electronic component 110. The other electronic component 112 may be a non-environmentally sensitive electronic component or another kind of environmental-sensitive electronic components less demanding about moisture barrier when compared with the environmental-sensitive electronic component 110. For example, the environmental-sensitive electronic component 110 may be an OLED element requiring the water vapour transmission rate (WVTR) less than $10^{-6}$ (g/m$^2$/day), while the other electronic component 112 may be the electrophoretic display (EPD) element requiring the water vapour transmission rate (WVTR) less than $10^{-2}$ (g/m$^2$/day). In this embodiment, the environmental-sensitive electronic component 110 is disposed at only one side of the predetermined folded region of the foldable package structure 700E, while the other electronic component 112 is disposed at the other side of the predetermined folded region. Accordingly, the laminated layer corresponding to the environmental-sensitive electronic component 110 and the other electronic component 112 arranged at two different sides of the predetermined folded region will not be the same. Corresponding to the side with the environmental-sensitive electronic component 110, the environmental-sensitive electronic component 110 is sandwiched by the first substrate 150a and the second ultra-thin glass plate 130b through the second and third adhesive layers 120a, 120b, and the first and second substrates 150a, 150b sandwich the environmental-sensitive electronic component 110 through the second ultra-thin glass plate 130b and the fourth adhesive layer 140b. Corresponding to the side with the environmental-sensitive electronic component 110, the sidewall barrier structure 160b is disposed on the surface of the second substrate 150b. When the foldable package structure is laminated and assembled together, the sidewall barrier structure 160b surrounds the four sides of the environmental-sensitive electronic component 110, thus enhancing the moisture barrier effect. However, corresponding to the other side with the other electronic component 112, the other electronic components 112 is sandwiched between the second and third adhesive layer 120a, 120b and the first and second substrates 150a, 150b are directly laminated to the second and third adhesive layers 120a, 120b. That is, corresponding to the other side with the other electronic component 112, the ultra-thin glass plate, the adhesive layer(s) or the sidewall barrier structure is omitted. As the ultra-thin glass plate is omitted in certain region, the first and second substrates 150a, 150b may include a plastic barrier film, a metal foil barrier film, a glass fiber barrier film, or a composite material barrier film, so as to provide a moisture barrier effect. In this embodiment, the span and location of the sidewall barrier structure 160b only correspond to the location of the environmental-sensitive electronic component 110, but do not extend to correspond to the location of the other electronic component 112.

Figure 16:
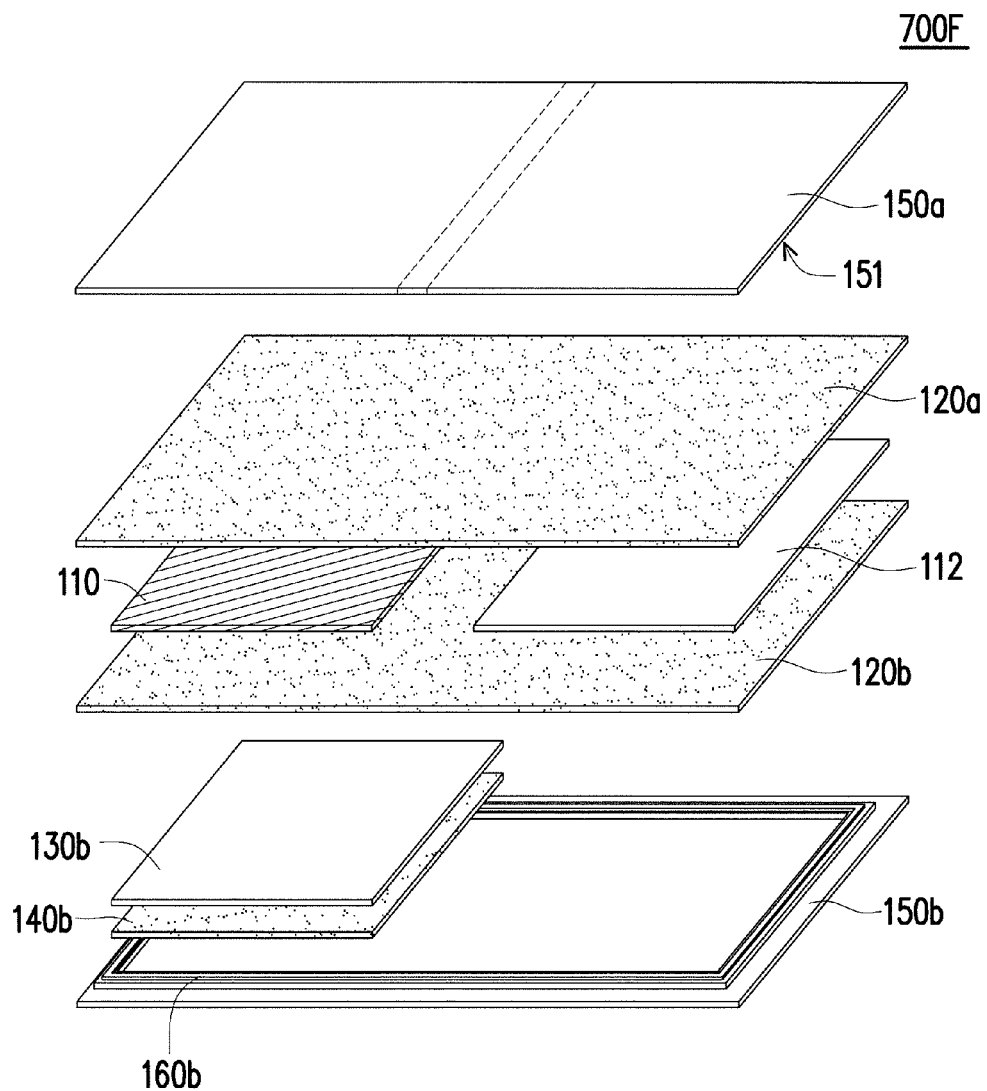
FIG. 16 is a schematic view of a foldable package structure according to one embodiment of the present disclosure.

FIG. 16 is a schematic view of a foldable package structure according to another embodiment of the present disclosure. FIG. 16 is a schematic exploded view of the foldable package structure before assembling the electronic component and the layers to be laminated together (the laminated layers). In FIG. 16, the electronic component and the laminated layers are shown to be separated from one another. In this embodiment, the environmental-sensitive electronic component 110 is disposed at only one side of the predetermined folded region of the foldable package structure 700F, while the other electronic component 112 is disposed at the other side of the predetermined folded region. Accordingly, the laminated layer corresponding to the environmental-sensitive electronic component 110 and the other electronic component 112 arranged at two different sides of the predetermined folded region will not be the same. The sidewall barrier structure 160b is disposed on the surface of the second substrate 150b. When the foldable package structure is laminated and assembled together, the sidewall barrier structure 160b surrounds the environmental-sensitive electronic component 110 as well as the other electronic component 112, thus enhancing the moisture barrier effect. That is, as shown in FIG. 16, the span and location of the sidewall barrier structure 160b correspond to the locations of both of the environmental-sensitive electronic component 110 and the other electronic component 112.

As described in the above embodiments, the number of the electronic component(s) is not necessarily one or two, and may be more. Also the number of the predetermined folded region(s) of the foldable package structure may be designed to be one or more. In the following embodiment, it is designed to have two predetermined folded regions in the foldable package structure (i.e. tri-folded structure) and electronic components are equipped at both sides of either of the predetermined folded regions. Depending on the choice of the electronic components or its moisture barrier requirement, the packaging materials and the laminated structure of the foldable package structure may be modified accordingly.

Figure 17:
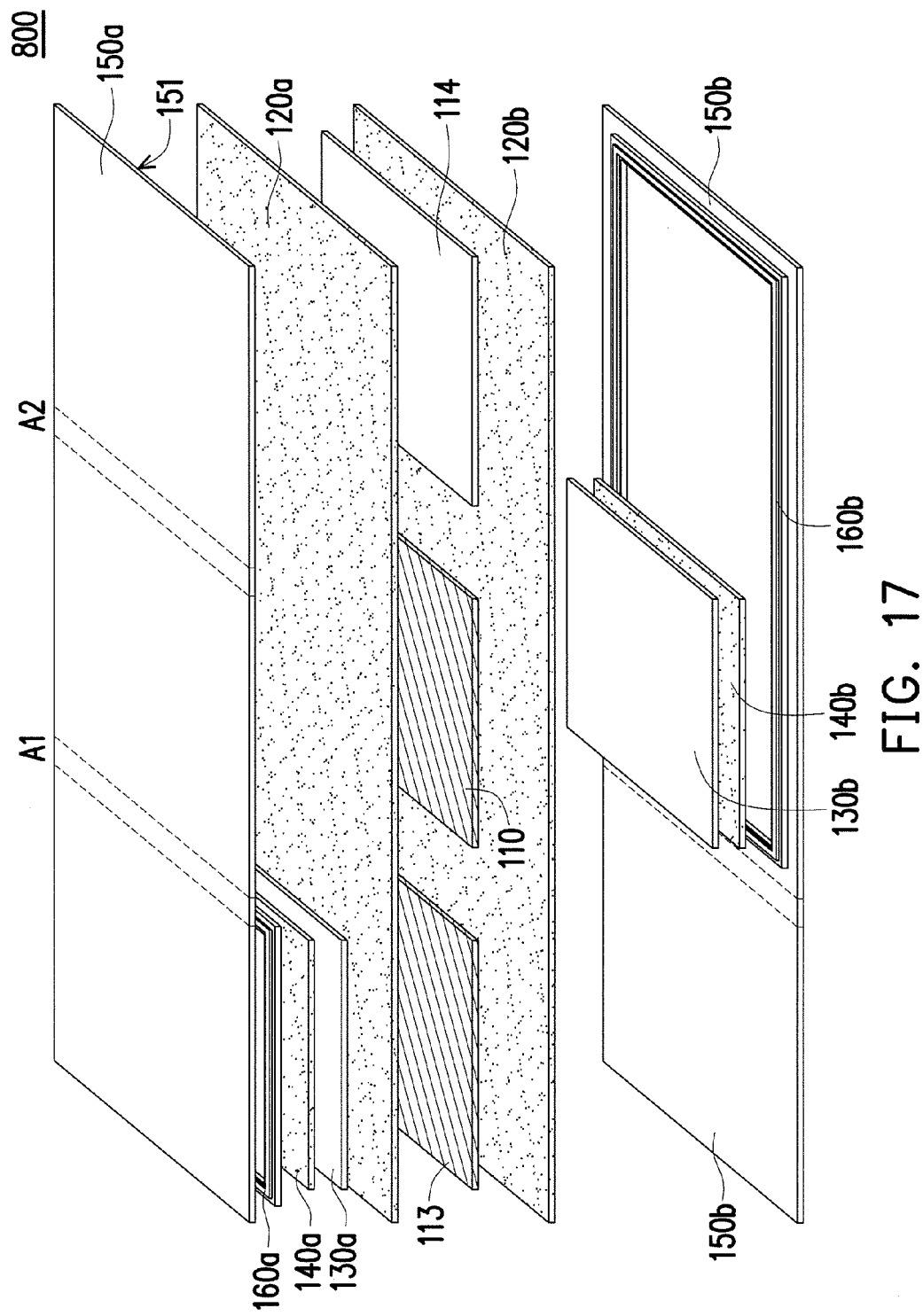
FIG. 17 is a schematic view of a foldable package structure according to one embodiment of the present disclosure.

FIG. 17 is a schematic view of a foldable package structure according to another embodiment of the present disclosure. FIG. 17 is a schematic exploded view of the foldable package structure before assembling the electronic component and the layers to be laminated together (the laminated layers). In FIG. 17, the electronic component and the laminated layers are shown to be separated from one another. Referring to FIG. 17, in the present embodiment, the foldable package structure 800 (from outermost to innermost) comprises the first and second substrates 150a, 150b, the first and fourth adhesive layers 140a, 140b, the first and second ultra-thin glass plates 130a, 130b, the second and third adhesive layers 120a, 120b, an environmental-sensitive electronic component 110, a first electronic component 113 and a second electronic component 114. These three electronic components are different from one another. The second electronic component 114 may be a non-environmentally sensitive electronic component, while the first electronic component 113 may be an environmental-sensitive electronic component less demanding about moisture barrier when compared with the environmental-sensitive electronic component 110. For example, the environmental-sensitive electronic component 110 may be an OLED element requiring the water vapour transmission rate (WVTR) less than $10^{-6}$ (g/m$^2$/day), the first electronic component 113 may be the electrophoretic display (EPD) element requiring the WVTR less than $10^{-2}$ (g/m$^2$/day), while the second electronic component 114 may be an organic sensing element requiring the WVTR less than $10^{-5}$ (g/m$^2$/day).

Compared with the foldable package structure 100 of the previous embodiment(s), the packaging materials or the laminated structure of the foldable package structure 800 of FIG. 17 are quite similar and the same reference numerals may be used to mark the same or similar parts. In this embodiment, these three electronic components 110, 113, 114 are respectively disposed beside the two predetermined folded regions A1, A2 (marked by the dotted lines) of the foldable package structure 800, keeping away from the two predetermined folded regions. In this embodiment, the environmental-sensitive electronic component 110 is disposed between the two predetermined folded regions A1, A2, the first electronic component 113 is arranged at the other side of the predetermined folded region A1, while the second electronic component 114 is disposed at the other side of the predetermined folded region A2. The arrangement of the laminated layers corresponding to different electronic components will not be the same. Corresponding to the side with the first electronic component 113, the first electronic component 113 is sandwiched between the second and third adhesive layer 120a, 120b, the second substrate 150b is directly laminated to the third adhesive layer 120b, but the first substrate 150a, the first adhesive layer 140a and the first ultra-thin glass plate 130a are laminated to the second adhesive layer 120a. The sidewall barrier structure 160a is disposed on the first substrate 150a.

In FIG. 17, corresponding to the side (the middle portion) with the environmental-sensitive electronic component 110, the environmental-sensitive electronic component 110 is sandwiched by the first substrate 150a and the second ultra-thin glass plate 130b through the second and third adhesive layers 120a, 120b, and the substrate 150b is laminated to the second ultra-thin glass plate 130b through the fourth adhesive layer 140b. Corresponding to the side with the second electronic component 114, the second electronic components 114 is sandwiched between the second and third adhesive layer 120a, 120b and the first and second substrates 150a, 150b are directly laminated to the second and third adhesive layers 120a, 120b. Corresponding to the sides with the environmental-sensitive electronic component 110 and the second electronic component 114, the sidewall barrier structure 160b is disposed on the surface of the substrate 150b. When the foldable package structure is laminated and assembled together, the sidewall barrier structure 160b surrounds the sides of the environmental-sensitive electronic component 110 as well as the second electronic component 114, thus enhancing the moisture barrier effect.

That is, corresponding to the side with the second electronic component 114, the ultra-thin glass plate and the adhesive layer(s) are omitted for the top and bottom laminated substrates. As the ultra-thin glass plate is omitted in certain regions, the first and second substrates 150a, 150b may include a plastic barrier film, a metal foil barrier film, a glass fiber barrier film, or a composite material barrier film, so as to provide a moisture barrier effect.

As shown in the foregoing embodiments, both the top (upper) and bottom (lower) laminated substrates can be designed or configured with one or more ultra-thin glass plates or only the top or the bottom laminated substrate is equipped with the ultra-thin glass plate. In addition, the adhesive layer(s) may be designed to be a single or multiple pieces. Based on the amount or the kind of the electronic element used, the number and location of the used ultra-thin glass plates or sheets may be modified. The design of the sidewall barrier structure(s) may also be adjustable, either located on the top laminated substrate, the bottom laminated substrate or on both laminated substrates, and the location thereof may be designed to surround one or more sides of the specific electronic component or of all the electronic components. The sidewall barrier structure may be designed to be a continuous wall structure or a discontinuous wall structure, and the materials of the sidewall barrier structures at different sides may be different. Depending on the product requirement of the package structure, the package structure may further include reinforced barrier layer(s) located at or around the folded region to protect the moisture barrier effect of the folded region(s) being impaired.

In conclusion, through the arrangement of the ultra-thin glass plates in the top and/or bottom laminated substrate, the foldable package structure of the present disclosure embodiments can be bended and folded as needed. The predetermined folded region(s) may be equipped with reinforced barrier layer(s), so that the foldable package structure can maintain the moisture barrier effect after repeated folding, and the performance as well as the electrical characteristics of the panel are maintained. Optionally, the foldable package structure also comprises the sidewall barrier structure(s) at various locations to further strengthen the barrier capability against the environmental factors.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A foldable package structure, for packaging at least one environmental-sensitive electronic component, the foldable package structure comprising:
   a first laminated substrate, wherein the first laminated substrate comprises a first substrate, a first adhesive layer and at least two pieces of a first ultra-thin glass plate;
   a second laminated substrate, disposed on one side of the first laminated substrate, wherein the second laminated substrate comprises a second substrate;
   a second adhesive layer, disposed on the first laminated substrate and located between the first and second laminated substrates;
   at least one environmental-sensitive electronic component, disposed on the second adhesive layer and located between the first and second laminated substrates; and
   a third adhesive layer, disposed between the at least one environmental-sensitive electronic component and the second laminated substrate, wherein the foldable package structure comprises at least one predetermined folded region, the at least two pieces of the first ultra-thin glass plate are disposed respectively at two opposite sides of the at least one predetermined folded region but keep away from the at least one predetermined folded region.

2. The foldable package structure of claim 1, wherein the first laminated substrate further comprises at least a reinforced barrier layer located between the two pieces of the first ultra-thin glass plate and located within the at least one predetermined folded region.

3. The foldable package structure of claim 1, further comprising a sidewall barrier structure disposed between the first and second laminated substrates and located by at least one side of the at least one environmental-sensitive electronic component.

4. The foldable package structure of claim 1, wherein a material of the first substrate or the second substrate comprises polyimide (PI), hybrid PI, polyethylene terephthalate (PET), polyether sulfone (PES), polyethylene naphthalate (PEN), cyclic olefin polymer (COP), or glass fiber reinforced plastics.

5. The foldable package structure of claim 1, wherein the first laminated substrate or the second laminated substrate comprises a substrate, an ultra-thin glass plate and an adhesive layer.

6. The foldable package structure of claim 1, wherein a material of the first adhesive layer, the second adhesive layer or the third adhesive layer comprises an optical adhesive, a thermosetting glue or a UV-curing glue.

7. The foldable package structure of claim 1, wherein the at least one environmental-sensitive electronic component is an organic light-emitting diode (OLED) element, an electrophoretic display element, a liquid crystal display (LCD) element, an organic sensing element or a solar panel.

8. The foldable package structure of claim 1, wherein the second laminated substrate comprises the second substrate, a fourth adhesive layer and at least two pieces of a second ultra-thin glass plate, the at least two pieces of the second ultra-thin glass plate are respectively disposed at two opposites sides of the at least one predetermined folded region but keep away from the at least one predetermined folded region.

9. The foldable package structure of claim 8, wherein the second laminated substrate further comprises a reinforced barrier layer disposed between the at least two pieces of the second ultra-thin glass plate and located within the at least one predetermined folded region.

10. The foldable package structure of claim 8, further comprising a sidewall barrier structure disposed between the first and second laminated substrates and located by at least one side of the at least one environmental-sensitive electronic component.

11. The foldable package structure of claim 8, wherein a material of the fourth adhesive layer comprises an optical adhesive, a thermosetting glue or a UV-curing glue.

12. The foldable package structure of claim 8, further comprising an intermediate barrier layer and the at least one environmental-sensitive electronic component is directly attached to the intermediate barrier layer, and the second and third adhesive layers sandwich the at least one environmental-sensitive electronic component and the intermediate barrier layer in-between.

13. A foldable package structure, comprising:
a first laminated substrate, wherein the first laminated substrate comprises a first substrate, a first adhesive layer and a first ultra-thin glass plate;
a second laminated substrate, disposed on an opposing side of the first laminated substrate, wherein the second laminated substrate comprises a second substrate;
a second adhesive layer, disposed on the first laminated substrate;
a first electronic component, disposed on the second adhesive layer and between the first and second laminated substrates, wherein the first electronic element is an environmental-sensitive electronic component;
a second electronic component, disposed on the second adhesive layer and between the first and second laminated substrates, wherein the second electronic component has an environmental-blocking requirement different from that of the first electronic component; and
a third adhesive layer, disposed between the first and second electronic components and the second laminated substrate, wherein the foldable package structure comprises at least one predetermined folded region, the first electronic component is arranged at one side of the at least one predetermined folded region, while the second electronic component is arranged at the other side of the at least one predetermined folded region, the first ultra-thin glass plate is arranged corresponding to the one side of the at least one predetermined folded region with the first electronic component and keeps away from the at least one predetermined folded region as well as the other side of the at least one predetermined folded region with the second electronic component.

14. The foldable package structure of claim 13, wherein the first laminated substrate further comprises a reinforced barrier layer located in the at the least one predetermined folded region.

15. The foldable package structure of claim 13, further comprising a sidewall barrier structure disposed between the first and second laminated substrates and located by at least one side of the at least one environmental-sensitive electronic component.

16. The foldable package structure of claim 13, wherein a material of the first substrate comprises polyimide (PI), hybrid PI, polyethylene terephthalate (PET), polyether sulfone (PES), polyethylene naphthalate (PEN), cyclic olefin polymer (COP), or glass fiber reinforced plastics.

17. The foldable package structure of claim 13, wherein the first laminated substrate or the second laminated substrate comprises a substrate, an ultra-thin glass plate and an adhesive layer.

18. The foldable package structure of claim 13, wherein a material of the first adhesive layer, the second adhesive layer or the third adhesive layer comprises an optical adhesive, a thermosetting glue or a UV-curing glue.

19. The foldable package structure of claim 13, wherein the at least one environmental-sensitive electronic component is an organic light-emitting diode (OLED) element, an electrophoretic display element, a liquid crystal display (LCD) element, an organic sensing element or a solar panel.

20. The foldable package structure of claim 13, wherein the second laminated substrate comprises the second substrate, a fourth adhesive layer and a second ultra-thin glass plate, the second ultra-thin glass plate is arranged corresponding to the one side of the at least one predetermined folded region with the first electronic component but keeps away from the at least one predetermined folded region as well as the other side of the at least one predetermined folded region with the second electronic component.

21. The foldable package structure of claim 20, wherein the second laminated substrate further comprises a reinforced barrier layer disposed within the at least one predetermined folded region.

22. The foldable package structure of claim 20, wherein the second laminated substrate further comprises a sidewall barrier structure disposed between the first and second laminated substrates and surrounding the first electronic component.

23. The foldable package structure of claim 20, wherein a material of the second substrate comprises polyimide (PI), hybrid PI, polyethylene terephthalate (PET), polyether sulfone (PES), polyethylene naphthalate (PEN), cyclic olefin polymer (COP), or glass fiber reinforced plastics.

24. The foldable package structure of claim 20, wherein a material of the fourth adhesive layer comprises an optical adhesive, a thermosetting glue or a UV-curing glue.

25. The foldable package structure of claim 20, further comprising an intermediate barrier layer and the at least one environmental-sensitive electronic component is directly attached to the intermediate barrier layer, and the second and third adhesive layers sandwich the at least one environmental-sensitive electronic component and the intermediate barrier layer in-between.

* * * * *